US009502427B2

United States Patent
Shin et al.

(10) Patent No.: US 9,502,427 B2
(45) Date of Patent: Nov. 22, 2016

(54) NON-VOLATILE MEMORY DEVICE AND METHOD OF MANUFACTURING THE SAME

(71) Applicant: SAMSUNG ELECTRONICS CO., LTD., Suwon-si, Gyeonggi-do (KR)

(72) Inventors: Jae-Jin Shin, Seoul (KR); Kyung-Hyun Kim, Seoul (KR); Jung-Hun No, Suwon-si (KR); Choong-Kee Seong, Seoul (KR); Seung-Pil Chung, Seoul (KR); Jung-Geun Jee, Seoul (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/047,840

(22) Filed: Feb. 19, 2016

(65) Prior Publication Data
US 2016/0260726 A1    Sep. 8, 2016

(30) Foreign Application Priority Data
Mar. 5, 2015  (KR) .................... 10-2015-0031060

(51) Int. Cl.
*H01L 21/8234*    (2006.01)
*H01L 27/115*    (2006.01)

(52) U.S. Cl.
CPC . *H01L 27/11521* (2013.01); *H01L 21/823462* (2013.01); *H01L 21/823481* (2013.01)

(58) Field of Classification Search
CPC .................... H01L 21/76; H01L 27/11521
See application file for complete search history.

(56) References Cited

U.S. PATENT DOCUMENTS

| 4,844,515 A | 7/1989 | Field |
| 6,287,979 B1 | 9/2001 | Zhou et al. |
| 6,492,245 B1 | 12/2002 | Liu et al. |
| 7,679,133 B2 | 3/2010 | Son et al. |
| 7,884,415 B2 | 2/2011 | Nagano |
| 8,053,347 B2 | 11/2011 | Kang et al. |
| 8,212,308 B2 | 7/2012 | Nishihara et al. |
| 8,362,542 B2 | 1/2013 | Kang et al. |
| 8,492,224 B2 | 7/2013 | Purayath et al. |
| 8,553,466 B2 | 10/2013 | Han et al. |
| 8,559,235 B2 | 10/2013 | Yoon et al. |

(Continued)

FOREIGN PATENT DOCUMENTS

| KR | 1987-0008144 A | 9/1987 |
| KR | 10-2012-0007219 A | 1/2012 |

(Continued)

*Primary Examiner* — Zandra Smith
*Assistant Examiner* — Andre' C Stevenson
(74) *Attorney, Agent, or Firm* — Lee & Morse P.C.

(57) ABSTRACT

A preliminary tunnel insulation pattern and a preliminary charge storage pattern are formed on each active pattern extending in a direction, and a trench is defined between structures including the active pattern, the preliminary tunnel insulation pattern and the preliminary charge storage pattern. A preliminary isolation pattern partially fills the trench. A dielectric layer and a control gate electrode layer are formed on the preliminary charge storage pattern and the preliminary isolation pattern. The control gate electrode layer, the dielectric layer, the preliminary charge storage pattern and the preliminary tunnel insulation pattern are patterned to form gate structures including a tunnel insulation pattern, a charge storage pattern, a dielectric layer pattern and a control gate electrode. The preliminary isolation pattern is isotropically etched to form an isolation pattern and a first air gap. An insulating interlayer is formed between the gate structures to keep the first air gap.

15 Claims, 21 Drawing Sheets

(56) References Cited

U.S. PATENT DOCUMENTS

| | | |
|---|---|---|
| 8,603,890 B2 | 12/2013 | Purayath et al. |
| 8,654,587 B2 | 2/2014 | Yoon et al. |
| 8,883,588 B2 | 11/2014 | Ahn et al. |
| 2010/0230741 A1* | 9/2010 | Choi ................ H01L 21/76229 257/324 |
| 2011/0233648 A1 | 9/2011 | Seol et al. |
| 2013/0105881 A1* | 5/2013 | Kai .................. H01L 29/42332 257/319 |
| 2013/0264628 A1* | 10/2013 | Koval ............... H01L 21/30604 257/316 |
| 2014/0024192 A1 | 1/2014 | Kim et al. |
| 2014/0159135 A1 | 6/2014 | Fujimoto et al. |

FOREIGN PATENT DOCUMENTS

| | | |
|---|---|---|
| KR | 10-2013-0060419 A | 6/2013 |
| KR | 10-2014-0012443 A | 2/2014 |

\* cited by examiner

NON-VOLATILE MEMORY DEVICE AND METHOD OF MANUFACTURING THE SAME

CROSS-REFERENCE TO RELATED APPLICATION

Korean Patent Application No. 10-2015-0031060, filed on Mar. 5, 2015, in the Korean Intellectual Property Office, and entitled: "Non-Volatile Memory Device and Method of Manufacturing the Same," is incorporated by reference herein in its entirety.

BACKGROUND

1. Field

Example embodiments relate to a non-volatile memory device and a method of manufacturing the same. More particularly, example embodiments relate to a non-volatile memory device having an air-gap and a method of manufacturing the same.

2. Description of the Related Art

As a non-volatile memory device is highly integrated, parasitic capacitance between wirings, gates, and active regions is increased. Thus, it is required to develop a non-volatile memory device having a low parasitic capacitance and a method of manufacturing the non-volatile memory device.

SUMMARY

According to example embodiments, there is provided a method of manufacturing a non-volatile memory device. In the method, a preliminary tunnel insulation pattern and a preliminary charge storage pattern are sequentially formed on each of a plurality of active patterns of a substrate. Each of the plurality of active patterns extends in a first direction, and a trench is defined between structures each including the active pattern, the preliminary tunnel insulation pattern and the preliminary charge storage pattern sequentially stacked. A liner is formed on an inner wall of the trench. A preliminary isolation pattern is formed on the liner to partially fill the trench, and the preliminary insulation layer pattern includes a material different from a material of the liner. A dielectric layer and a control gate electrode layer are sequentially formed on the preliminary charge storage pattern, the liner and the preliminary isolation pattern. The control gate electrode layer, the dielectric layer, the preliminary charge storage pattern and the preliminary tunnel insulation pattern are patterned to form a plurality of gate structures each extending in a second direction substantially perpendicular to the first direction. Each of the gate structure includes a tunnel insulation pattern, a charge storage pattern, a dielectric layer pattern and a control gate electrode sequentially stacked. A portion of the preliminary isolation pattern is isotropically etched to form an isolation pattern and a first air gap on the isolation pattern, and the first air gap extends in the first direction and having a bent top. A first length of the first air gap under the gate structures in a third direction substantially perpendicular to a top surface of the substrate is greater than a first width of the first air gap under the gate structures in the second direction. An insulating interlayer is formed between the gate structures to keep the first air gap.

In example embodiments, the isolation pattern may include silicon oxide having pores therein more than pores of silicon oxide included in the tunnel insulation pattern and the dielectric layer pattern.

In example embodiments, the isolation pattern may include a spin on glass (SOG).

In example embodiments, the silicon oxide included in the tunnel insulation pattern and the dielectric layer pattern may be formed by a thermal oxidation process, a chemical vapor deposition (CVD) process or a high density plasma CVD (HDP-CVD) process.

In example embodiments, the isotropically etching may be performed using a gas containing fluorine and $H_2O$ vapor as an etching gas.

In example embodiments, the gas containing fluorine may include CxFy or CHxFy.

In example embodiments, in the isotropically etching, the $H_2O$ vapor may be absorbed into the preliminary isolation pattern, and the preliminary isolation pattern having moisture may be partially removed using the gas containing fluorine.

In example embodiments, the isotropically etching may be performed at a temperature of about 5° C. to about 50° C.

In example embodiments, the isolation pattern may be formed to have a top surface lower than about 70% of a height of the active pattern.

In example embodiments, when the insulating interlayer is formed, a second air gap under the insulating interlayer may be formed to be in fluid communication with the first air gap.

According to example embodiments, there is provided a non-volatile memory device. The vertical non-volatile memory device include a substrate including a plurality of active patterns spaced apart from each other in a second direction, each of the active patterns extending in a first direction substantially perpendicular to the second direction, a plurality of gate structures on the substrate, each of the gate structures extending in the second direction and including a tunnel insulation pattern, a charge storage pattern, a dielectric layer pattern, and a control gate electrode sequentially stacked, a liner on an inner wall of a trench between the active patterns, an isolation pattern partially filling the trench on the liner, the isolation pattern being spaced apart from the dielectric layer pattern and including a material different from a material of the liner, and a first air gap extending in the first direction on the isolation pattern and having a bent top. A first length of the first air gap under the gate structures in a third direction substantially perpendicular to a top surface of the substrate is greater than a first width of the first air gap under the gate structures in the second direction.

In example embodiments, each of the top and bottom of the first air gap under the gate structures may have a rounded shape, and the first air gap may have a long oval shape in a cross-sectional view taken along in the second direction.

In example embodiments, the isolation pattern may include silicon oxide having pores more than pores of silicon oxide included in the tunnel insulation pattern and the dielectric layer pattern.

In example embodiments, a first length in the third direction of the first air gap may be about 1.5 times to about 6 times of the first width in the second direction of the first air gap.

In example embodiments, a portion of a top surface of the isolation pattern under a center portion of a bottom of each of the gate structures protrudes from other portions of the top surface of the isolation pattern, and the top surface of the isolation pattern may be bent.

According to example embodiments, there is provided a method of manufacturing a non-volatile memory device. In the method, a plurality of active patterns formed on a substrate. Each of the plurality of active patterns extends in a first direction, and a trench is defined between the active patterns. A liner is formed on an inner wall of the trench. A preliminary isolation pattern formed on the liner to fill at least of portions of the trench, and the preliminary insulation layer pattern includes a material different from a material of the liner. A gate structure including a tunnel insulation pattern, a charge storage pattern, a dielectric layer pattern and a control gate electrode is formed on the active patterns, liner pattern and the preliminary isolation pattern. A portion of the preliminary isolation pattern is isotropically etched to form an isolation pattern and a first air gap on the isolation pattern, and the first air gap extends in the first direction and having a bent top. A first length of the first air gap under the gate structures in a third direction substantially perpendicular to a top surface of the substrate is greater than a first width of the first air gap under the gate structures in the second direction. An insulating interlayer is formed between the gate structures to keep the first air gap.

In example embodiments, the isolation pattern may include a spin on glass (SOG).

In example embodiments, the isotropically etching may be performed using a gas containing fluorine and $H_2O$ vapor as an etching gas.

In example embodiments, the gas containing fluorine may include CxFy or CHxFy.

In example embodiments, in the isotropically etching, the $H_2O$ vapor may be absorbed into the preliminary isolation pattern, and the preliminary isolation pattern having moisture may be partially removed using the gas containing fluorine.

According to example embodiments, there is provided a method of manufacturing a non-volatile memory device, including sequentially forming a preliminary tunnel insulation pattern and a preliminary charge storage pattern on each of a plurality of active patterns of a substrate, each of the plurality of active patterns extending in a first direction, defining a trench between structures, each structure including an active pattern of the plurality of active patterns, a corresponding preliminary tunnel insulation pattern, and a corresponding preliminary charge storage pattern sequentially stacked, forming a liner on an inner wall of the trench, forming a preliminary isolation pattern on the liner to partially fill the trench, the preliminary isolation pattern including a material different from a material of the liner, sequentially forming a dielectric layer and a control gate electrode layer on the preliminary charge storage pattern, the liner, and the preliminary isolation pattern, patterning the control gate electrode layer, the dielectric layer, the preliminary charge storage pattern, and the preliminary tunnel insulation pattern to form a plurality of gate structures separated by a space, each gate structure extending in a second direction substantially perpendicular to the first direction, and each of the gate structure including a tunnel insulation pattern, a charge storage pattern, a dielectric layer pattern, and a control gate electrode sequentially stacked, and isotropically etching a portion of the preliminary isolation pattern in each trench through the space between the gate structure to form a first air gap between the isolation pattern and the dielectric layer, such that a distance between a top surface of a resultant isolation pattern and a bottom of the substrate is smaller than a distance between a top surface of an adjacent active pattern and the bottom of the substrate.

Forming the preliminary isolation pattern in the trench may include filling the trench with silicon oxide having pores therein.

Isotropically etching the portion of the preliminary isolation pattern may be performed using a gas containing fluorine and $H_2O$ vapor as an etching gas.

The preliminary isolation pattern may have a higher etching rate than the tunnel insulation pattern and the dielectric layer pattern.

Isotropically etching the portion of the preliminary isolation pattern may include forming the first air gap with a height between the isolation pattern and the dielectric layer that is greater than a width of the trench.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1:
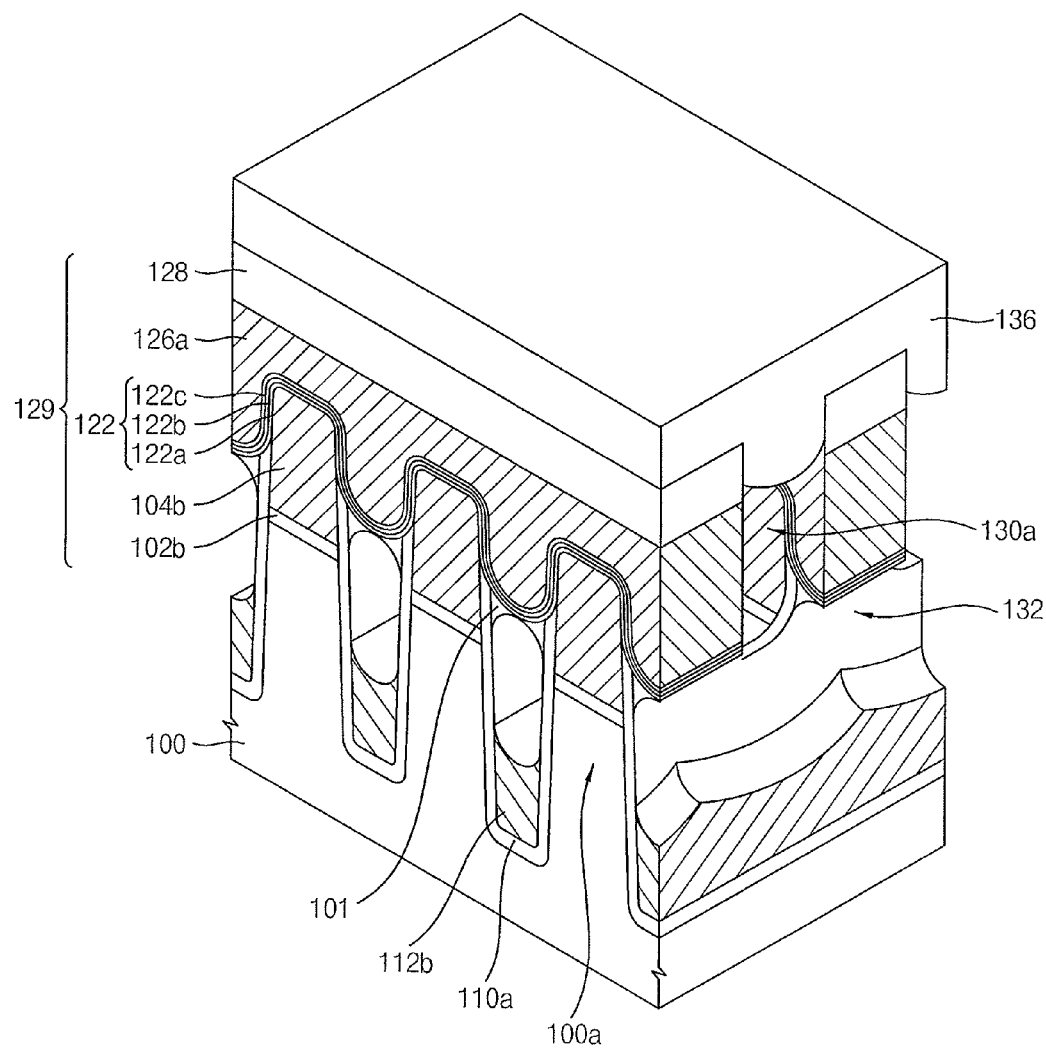
FIGS. 1, 2, and 3 illustrate a perspective view, a side view, and a plan view of a non-volatile memory device in accordance with example embodiments, respectively.
Figure 1:
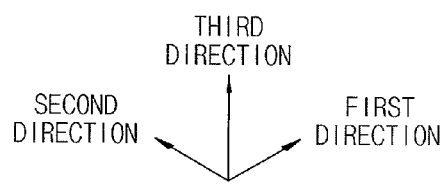

Various example embodiments will be described more fully hereinafter with reference to the accompanying drawings, in which some example embodiments are shown. The example embodiments may, however, be embodied in many different forms and should not be construed as limited to those set forth herein. Rather, these example embodiments are provided so that this description will be thorough and complete, and will fully convey the scope of the exemplary implementations to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
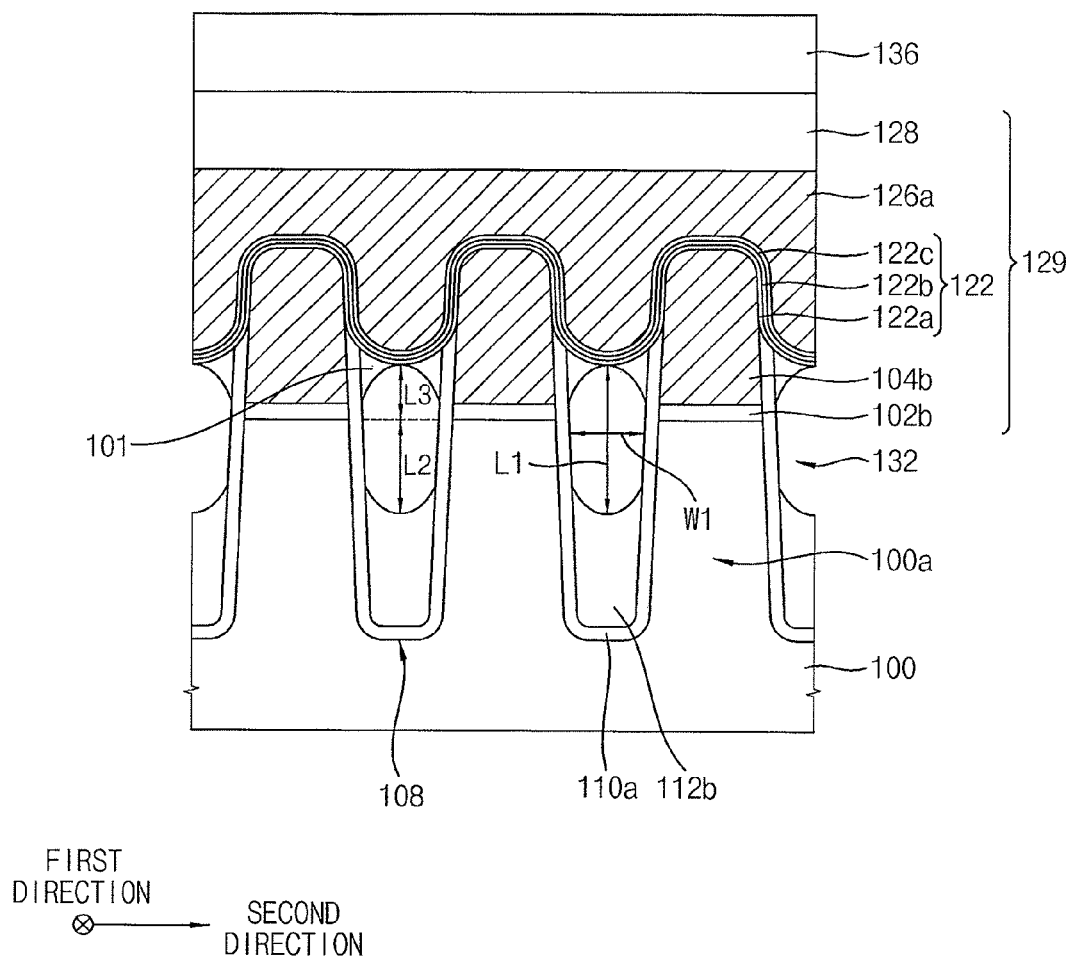
Figure 3:
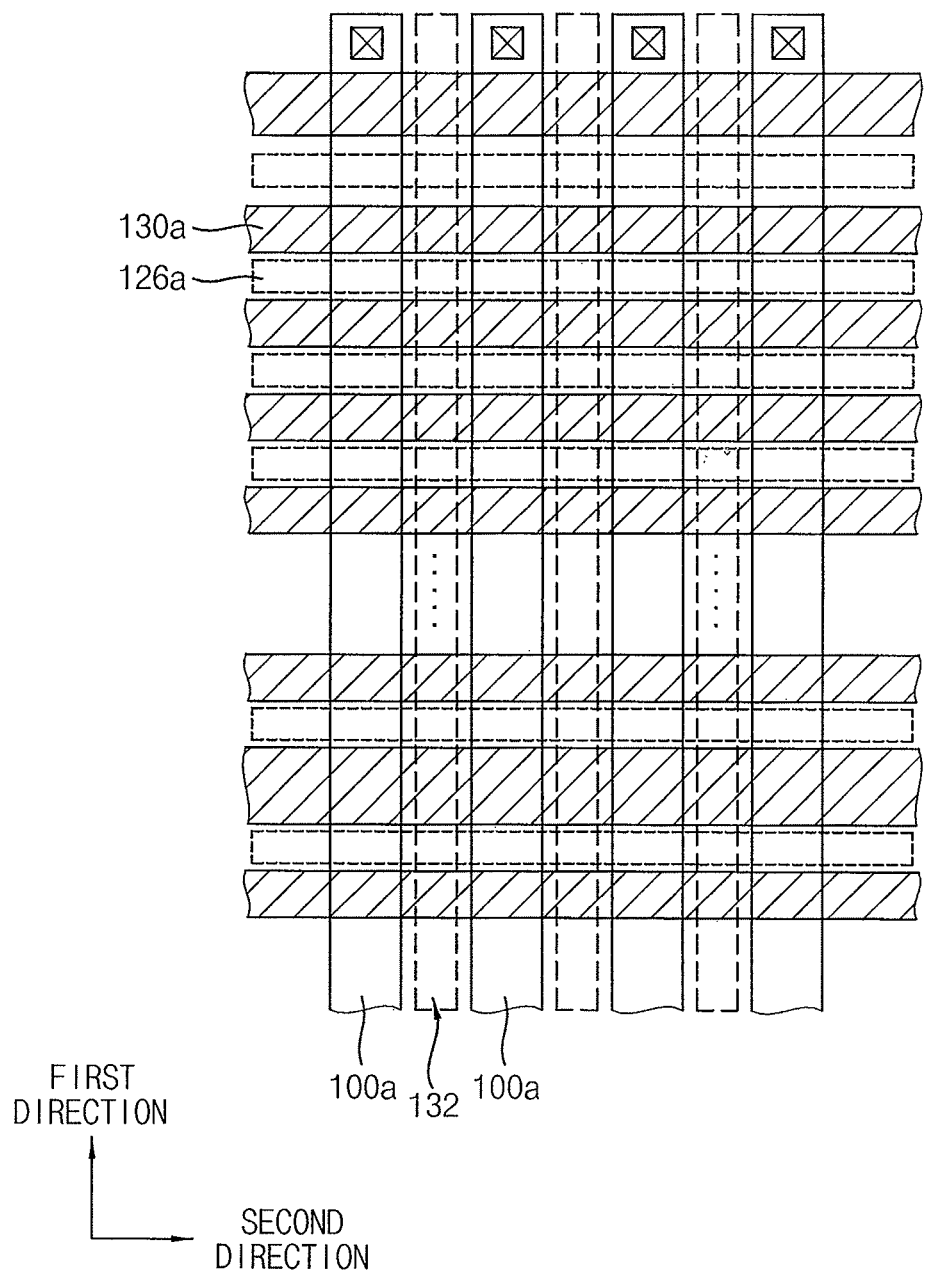

FIGS. 1, 2 and 3 are a perspective view, a side view and a plan view, respectively, illustrating a non-volatile memory device in accordance with example embodiments. It is noted that FIG. 2 is a side view as viewed in a plane defined by the second and third directions.

Referring to FIGS. 1 to 3, the non-volatile memory device may be formed on a substrate 100 including a plurality of active patterns 100a extending in a first direction between neighboring two first trenches 108 of a plurality of first trenches 108 thereon. The non-volatile memory device may further include an isolation pattern 112b filling a lower portion of each of the first trenches 108, and a gate structure 129 extending in a second direction substantially perpendicular to the first direction. The gate structure 129 may include a tunnel insulation pattern 102b, a floating gate pattern 104b, a dielectric layer structure 122, and a control gate pattern 126a. The dielectric layer structure 122 may be spaced apart from the isolation pattern 112b in a third direction substantially perpendicular to a top surface of the substrate 100 and may cover upper portions of the first trenches 108, so that a first air gap 132 may be formed between the isolation pattern 112b and the dielectric layer structure 122. For example, as illustrated in FIGS. 1-2, a portion of the dielectric layer structure 122 may extend into an upper portion of each first trench 108 to, e.g., completely, seal the upper portion of each first trench 108 at a predetermined vertical distance, e.g., along the third direction, from the isolation pattern 112b, such that the first air gap 132 may be defined in each first trench 108 between the dielectric layer structure 122 and the isolation pattern 112b.

The active pattern 100a and the first trench 108 may be alternately arranged in the second direction. The active pattern 100a may protrude from the substrate 100 in the third direction.

In example embodiments, a liner 110a may be conformally formed on a sidewall and a bottom of the first trench 108. The liner 110a may extend to a lower sidewall of the floating gate pattern 104b from the bottom of the first trench 108. The liner 110a may protect the sidewall of the first trench 108. In example embodiments, the liner 110a may include, e.g., silicon oxide, silicon nitride, silicon oxynitride, etc. The liner 110a may be formed by a chemical vapor deposition (CVD) process or a high density plasma CVD (HDP-CVD) process. Alternatively, the liner 110a may not be formed.

The isolation pattern 112b may be formed on the liner 110a. The isolation pattern 112b may be formed to fill, e.g., only, the lower portion of the first trench 108. The isolation pattern 112b may extend in the first direction. The isolation pattern 112b may include. e.g., silicon oxide having pores therein. In example embodiments, the isolation pattern 112b may include a spin on glass (SOG), e.g., hydrogensilsesquioxane (HSQ) SOG, silicate SOG, and doped silicate, etc.

The first air gap 132 may be formed on the isolation pattern 112b. Thus, a shape of a bottom of the first air gap 132 may be determined by a shape of a top surface of the isolation pattern 112b. For example, a first portion of the first air gap 132, which may be formed under the gate structure 129, may be defined by the top surface of the isolation pattern 112b, a bottom of the dielectric layer structure 122, an insulation layer pattern 101 beneath a portion of the bottom of the dielectric layer structure 122, and the liner 110a on the sidewall of the first trench 108. In another example, the insulation layer pattern 101 may cover all portions of the bottom of the dielectric layer structure 122 over the first trench 108, and thus the first portion of the first air gap 132 may be defined by the top surface of the isolation pattern 112b, the insulation layer pattern 101, and the liner 110a.

As the top surface of the isolation pattern 112b is lowered, a volume of the first air gap 132 may increase. In order to reduce the parasitic capacitance between the active patterns 100a, the top surface of the isolation pattern 112b may be lower than a top surface of the active pattern 100a, i.e., a distance between the top surface of the isolation pattern 112b and a bottom of the substrate 100 may be smaller than a distance between the top surface of the active pattern 100a and the bottom of the substrate 100. For example, the top surface of the isolation pattern 112b may be lower than about 70% of a height of the top surface of the active pattern 100a.

In a cross-sectional view taken along the first direction, the top surface of the first isolation pattern 112b may be bent (FIG. 2). A portion of the top surface of the first isolation pattern 112b under a center portion of a bottom of the gate structure 122 may protrude from other portions of the top surface of the first isolation pattern 112b. Thus, a bottom of the first air gap 132 may have a bent shape as viewed in the first direction (FIG. 2), and a portion of the first isolation pattern 112b facing the center portion of the bottom of the gate structure 122 may have a greatest length in the third direction, i.e., L1 in FIG. 2. Also, in a cross-sectional view taken along the second direction (FIG. 2), the top surface of the isolation pattern 112b may be concave upward.

The tunnel insulation pattern 102b may be formed on the active pattern 100a. In example embodiments, a plurality of tunnel insulation patterns 102b may be arranged to be spaced apart from each other both in the first and second directions. The tunnel insulation pattern 102b may include, e.g., silicon oxide. The tunnel insulation pattern 102b may include silicon oxide having neither crystal defects nor pores therein, and thus may not be etched in subsequent processes, and characteristics of the tunnel insulation pattern 102b may not be changed. In example embodiments, the tunnel insulation pattern 102b may be formed by, e.g., a thermal oxidation process, a CVD process or an HDP-CVD process.

The floating gate pattern 104b may be formed on the tunnel insulation pattern 102b. In example embodiments, a plurality of floating gate patterns 104b may be arranged to be spaced apart from each other both in the first and second directions. In example embodiments, the floating gate pattern 104b may include polysilicon doped with impurities, e.g., arsenic or phosphorus.

Alternatively, a charge trapping layer pattern (not shown) may be formed instead of the floating gate pattern 104b. In this case, the charge trapping layer pattern may include, e.g., silicon nitride.

The dielectric layer structure 122 may be formed, e.g., continuously, on the first floating gate pattern 104b and over the isolation pattern 112b to be spaced apart from the isolation pattern 112b. The dielectric layer pattern 122 may extend in the second direction, and a plurality of dielectric layer patterns 122 may be arranged to be spaced apart from each other in the first direction.

In example embodiments, the dielectric layer structure 122 may have a multi-layered structure of a silicon oxide layer pattern 122a, a silicon nitride layer pattern 122b, and a silicon oxide layer pattern 122c sequentially stacked. The silicon oxide layer patterns 122a and 122c may have neither crystal defects nor pores therein, and thus may not be etched in subsequent processes, and electrical characteristics of the silicon oxide layer patterns 122a and 122c of the dielectric layer structure 122 may not be changed. In example embodiments, the silicon oxide layer patterns 122a and 122c may be formed by a CVD process or an HDP-CVD process.

Alternatively, the dielectric layer structure 122 may include a metal oxide having a high dielectric constant, so that a capacitance may increase and leakage currents may decrease. For example, the metal oxide may include hafnium oxide, titanium oxide, tantalum oxide, zirconium oxide, aluminum oxide, etc.

In a cross-sectional view taken along the second direction, a bottom of the dielectric layer structure 122 over the first trench 108 may be convex downward.

The insulation layer pattern 101 may be formed beneath the bottom of the dielectric layer structure 122, and the insulation layer pattern 101 may include a material substantially the same as a material of the isolation pattern 112b. A top of the first air gap 132 may be defined by a bottom of the insulation layer pattern 101.

The first portion of the first air gap 132 may have a first length L1 in the third direction and a first width W1 in the second direction smaller than the first length L1 (FIG. 2). In example embodiments, the first length L1 may be about 1.5 times to about 6 times of the first width W1.

An uppermost level of the top of the first air gap 132 at the first portion thereof may be higher than that of the top surface of the active pattern 100a relative to a bottom of the substrate 100. A second length L2, i.e., a distance from a lowermost level of the bottom of the first air gap 132 at the first portion thereof to a level of the top surface of the active pattern 100a, may be about 1.5 times to about 5 times of a third length L3, i.e., a distance from the level of the top surface of the active pattern 100a to the uppermost level of the top of the first air gap 132 at the first portion thereof.

The top and bottom of the first air gap 132 at the first portion thereof may have rounded shapes. In a cross-sectional view taken along the second direction (FIG. 2), the first air gap 132 may have a long oval shape at the first portion thereof.

The control gate pattern 126a may be formed on the dielectric layer structure 122. The control gate pattern 126a may extend in the second direction, and a plurality of control gate patterns 126a may be arranged in the first direction. The control gate pattern 126a may serve as a word line. The control gate pattern 126a may include doped polysilicon and/or a metal. In example embodiments, the control gate pattern 126a may include a polysilicon pattern and a metal pattern sequentially stacked.

A hard mask 128 may be formed on the control gate pattern 126a. The hard mask 128 may include, e.g., silicon nitride, silicon oxynitride, etc.

A spacer may be formed on a sidewall of the gate structure 129. The spacer may include, e.g., silicon nitride and/or silicon oxynitride.

An insulating interlayer 136 may be formed on and between the gate structures 129. The insulating interlayer 136 may include, e.g., silicon oxide. The insulating interlayer 136 may not fill the first air gap 132, and may partially fill an upper portion of a gap between the gate structures 129.

The insulating interlayer 136 may be spaced apart from the top surface of the isolation pattern 112b. In example embodiments, the insulating interlayer 136 may fill a gap between the hard masks 128, so that a second air gap 130a may be formed between the control gate patterns 126a (FIG. 1). That is, a bottom of the insulating interlayer 136 may be higher than a bottom of the control gate pattern 126a. Thus, the second air gap 130a may extend in the second direction. The first and second air gaps 132 and 130a may be in communication with each other, and may intersect with each other (FIG. 3).

FIGS. 4 to 12 are cross-sectional views and perspective views of stages in a method of manufacturing the non-volatile memory device of FIGS. 1 to 3. Particularly. FIGS. 4 to 8 are cross-sectional views, and FIGS. 9 to 12 are perspective views.

Figure 4:
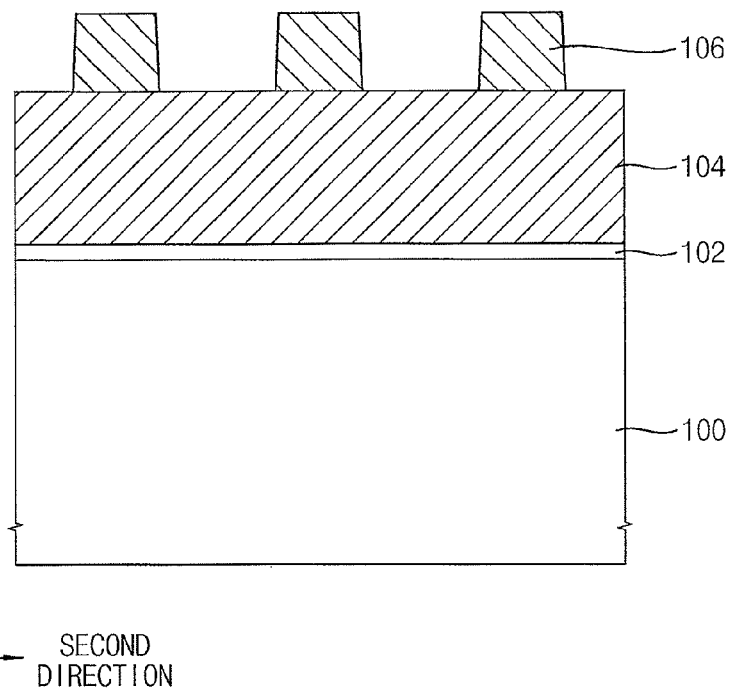
FIGS. 4 to 12 illustrate cross-sectional views and perspective views of stages in a method of manufacturing the non-volatile memory device of FIGS. 1 to 3.

Referring to FIG. 4, a tunnel insulation layer 102 and a floating gate layer 104 may be sequentially formed on the substrate 100. A first hard mask 106 may be formed on the floating gate layer 104.

The substrate 100 may be a semiconductor substrate, e.g., a silicon substrate, a germanium substrate, or a silicon-germanium substrate. Alternatively, the substrate 100 may be a silicon-on-insulator (SOI) substrate, or a germanium-on-insulator (GOD) substrate.

The tunnel insulation layer 102 may be formed of, e.g., silicon oxide. For example, the tunnel insulation layer 102 may not include crystal defects and pores therein. In example embodiments, the tunnel insulation layer 102 may be formed by a thermal oxidation process, a CVD process or an HDP-CVD process.

The floating gate layer 104 may be formed of doped polysilicon. In example embodiments, the floating gate layer 104 may be formed by a low pressure CVD (LP-CVD) process.

The first mask 106 may be a photoresist pattern or a hard mask. In example embodiments, the first mask 106 may be formed to extend in a first direction.

Figure 5:
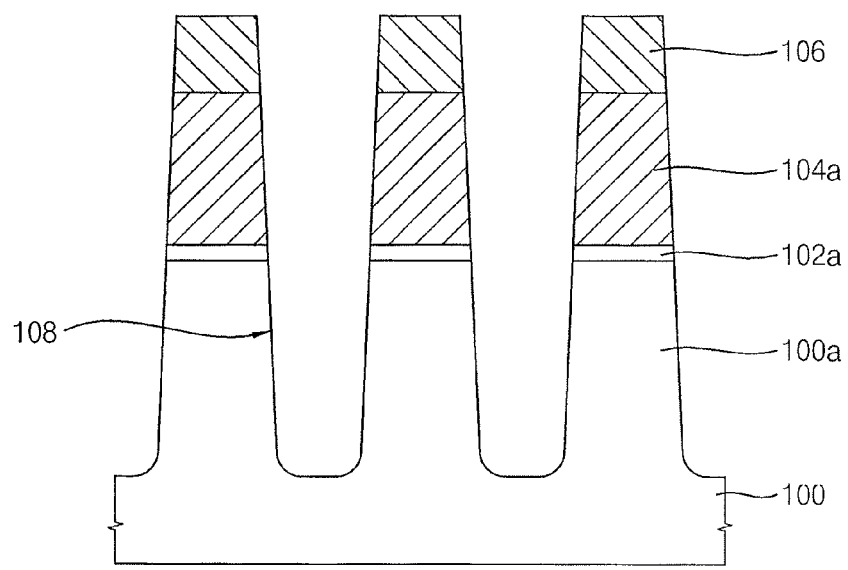

Referring to FIG. 5, the floating gate layer 104, the tunnel insulation layer 102 and an upper portion of the substrate 100 may be sequentially etched using the first mask 106 as an etching mask to form the active pattern 100a extending in the first direction, and a preliminary tunnel insulation pattern 102a and a preliminary floating gate pattern 104a on the active pattern 100a. Also, the first trench 108 may be formed between structures each including the preliminary tunnel insulation pattern 102a, the preliminary floating gate pattern 104a, and the active pattern 100a sequentially stacked.

The preliminary tunnel insulation pattern 102a and the preliminary floating gate pattern 104a may be formed to extend in the first direction, and a plurality of structures each including the preliminary tunnel insulation pattern 102a and the preliminary floating gate pattern 104a sequentially stacked may be arranged in a second direction substantially perpendicular to the first direction.

Figure 6:
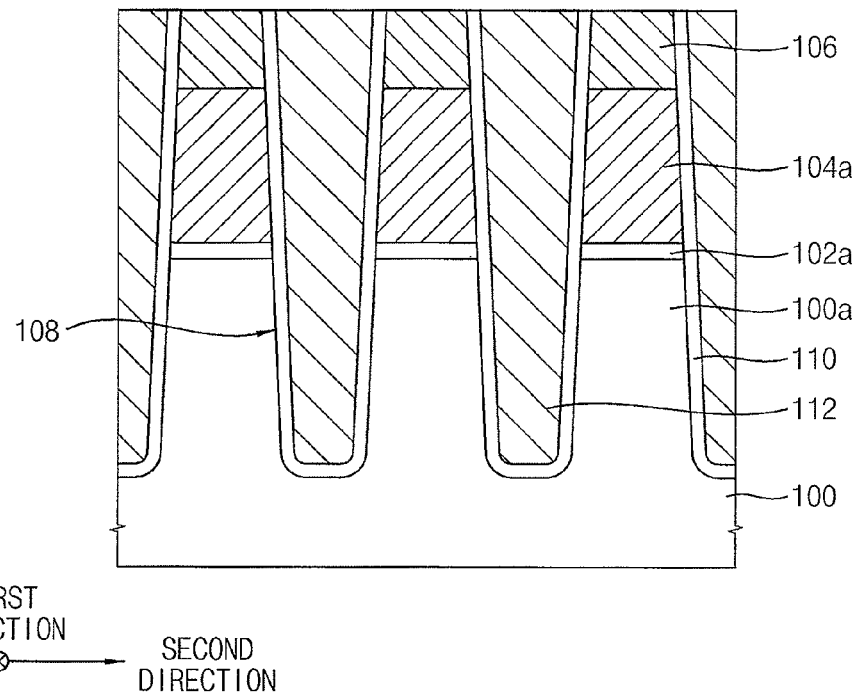

Referring to FIG. 6, a liner layer 110 may be conformally formed on an inner wall of the first trench 108 and the first mask 106. In example embodiments, the liner layer 110 may be formed of, e.g., silicon oxide, silicon nitride, silicon oxynitride, etc. The liner layer 110 may be formed by a CVD process or an atomic layer deposition (ALD) process. In some example embodiments, the liner layer 110 may not be formed.

A first preliminary insulation layer pattern 112 may be formed on the liner layer 110 to fill the first trench 108. In detail, an insulation layer may be formed to sufficiently fill the first trench 108. The insulation layer may include, e.g., silicon oxide having pores therein. The first insulation layer may include a spin on glass (SOG) such as HSQ SOG, silicate SOG, doped silicate, etc. The insulation layer may be planarized until a top surface of the first mask 106 may be exposed to form the first preliminary isolation pattern 112. In example embodiments, the planarization process may be performed by a chemical mechanical polishing (CMP) process and/or an etch back process.

Figure 7:
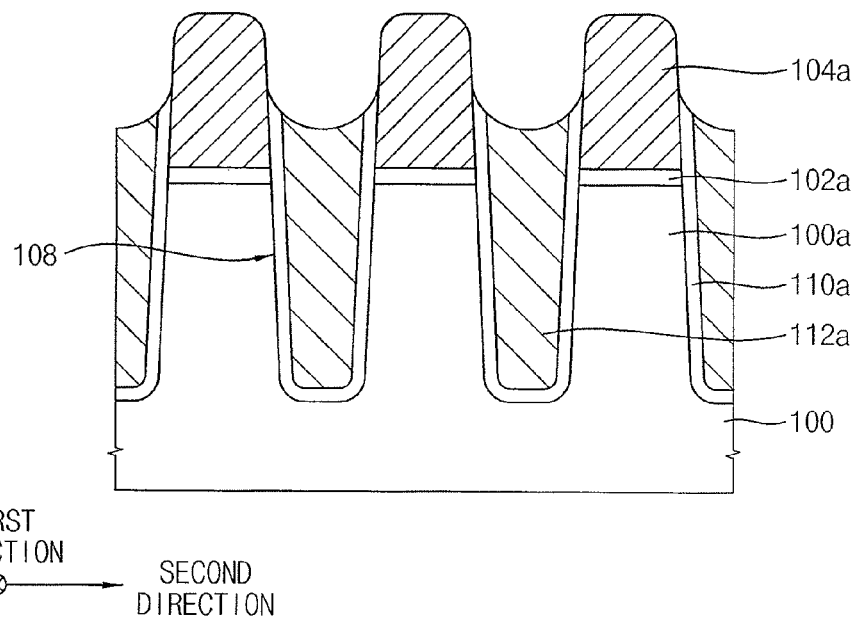

Referring to FIG. 7, upper portions of the first preliminary isolation pattern 112 and the liner layer 110 may be etched to form a second preliminary isolation pattern 112a and a liner 110a, respectively. The etching process may include an etch back process. By the etching process, an upper sidewall of the preliminary floating gate pattern 104a may be exposed. After the etching process, the first mask 106 may be removed. A top surface of the second preliminary isolation pattern 112a may be higher than a top surface of the preliminary tunnel insulation pattern 102a.

A dielectric layer structure 122 (refer to FIG. 10) may be formed on the second preliminary isolation pattern 112a by subsequent processes. Thus, a bottom of the dielectric layer structure 122 may have a shape corresponding to a shape of the top surface of the second preliminary isolation pattern 112. In a cross-sectional view taken along the second direction, the top surface of the second preliminary isolation pattern 112 may be concave upward.

Figure 8:
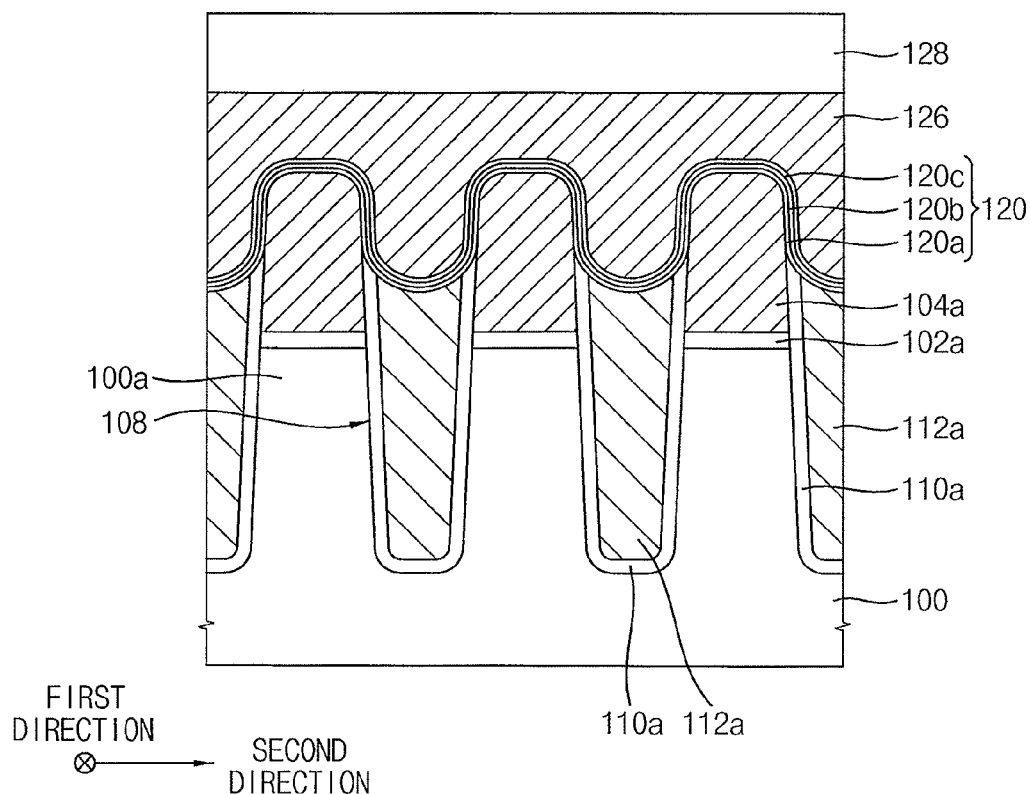
Figure 9:
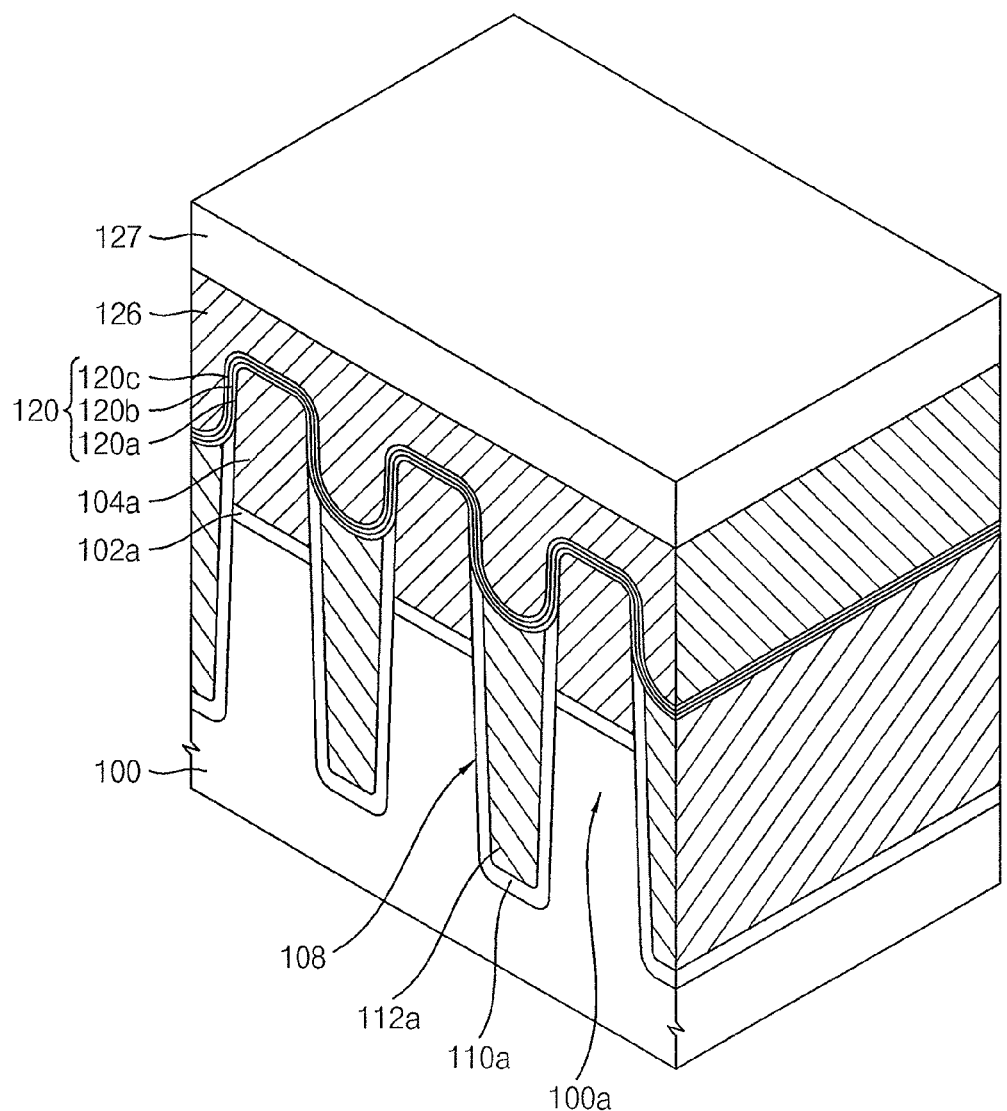

Referring to FIGS. 8 and 9, a preliminary dielectric layer structure 120 may be conformally formed on the preliminary floating gate pattern 104a and the second preliminary isolation pattern 112a. A control gate layer 126 and a hard mask layer 127 may be sequentially formed on the preliminary dielectric layer structure 120.

The preliminary dielectric layer structure 120 may be formed of, e.g., silicon oxide or silicon nitride. In example embodiments, the preliminary dielectric layer structure 120 may be formed to have a silicon oxide layer 120a, a silicon nitride layer 120b, and a silicon oxide layer 120c sequentially stacked. The silicon oxide layers 120a and 120c of the preliminary dielectric layer structure 120 may be formed by a CVD process or an HDP-CVD process.

Alternatively, the preliminary dielectric layer structure 120 may be formed using a metal oxide having a high dielectric constant. For example, the metal oxide may include hafnium oxide, titanium oxide, tantalum oxide, zirconium oxide, aluminum oxide, etc.

The control gate layer 128 may be formed of, e.g., doped polysilicon, a metal, a metal nitride, a metal silicide, etc. In example embodiments, the control gate layer 128 may be formed by sequentially forming a doped polysilicon layer (not shown) and a tungsten layer (not shown).

The hard mask layer 127 may be formed of, e.g., silicon nitride, silicon oxynitride, etc.

Figure 10:
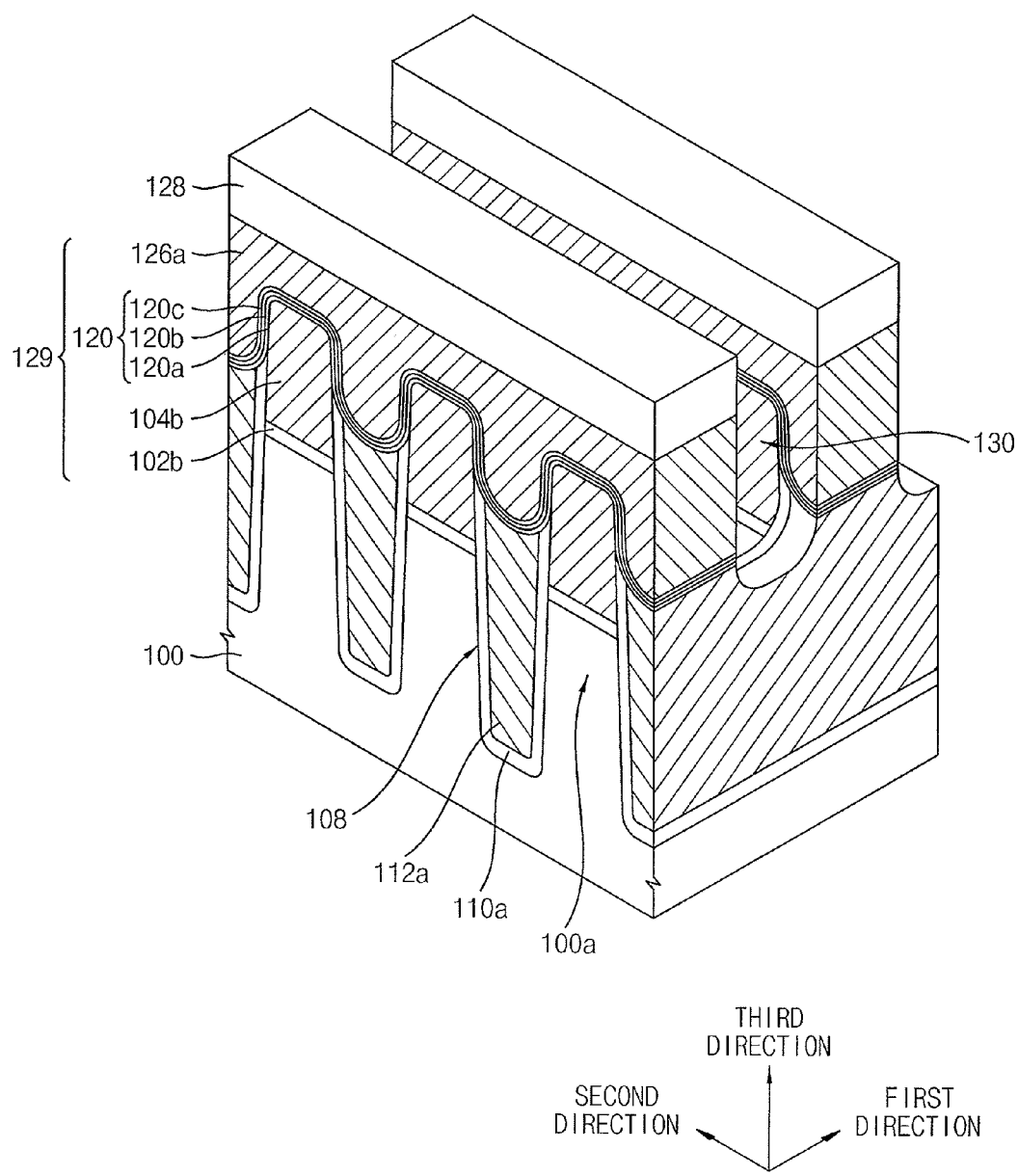

Referring to FIG. 10, the hard mask layer 127 may be patterned to form a hard mask 128. The hard mask 128 may extend in the second direction.

The control gate layer 126, the preliminary dielectric layer structure 120, the preliminary floating gate layer pattern 104a and the first tunnel insulation pattern 102a may be anisotropically etched using the hard mask 128 as an etching mask. Thus, a gate structure 129 including the tunnel insulation pattern 102b, the floating gate pattern 104b, the dielectric layer structure 122, and the control gate pattern 126a sequentially stacked may be formed on the substrate 100. Also, a second trench 130 may be formed between the gate structures 122. An upper surface of the second preliminary isolation pattern 112a may partially etched by the etching process.

In example embodiments, a plurality of tunnel insulation patterns 102b may be formed on the active patterns 100a, respectively, and a plurality of floating gate layer patterns 104b may be formed on the tunnel insulation patterns 102, respectively. Each of the dielectric layer structure 122 and the control gate pattern 126a may be formed to extend in the second direction. The control gate pattern 126 may serve as a word line.

Spacers may be formed on sidewalls of the gate structures 129. The spacers may be formed of, e.g., silicon nitride and/or silicon oxynitride. Alternatively, the spacers may not be formed to decrease parasitic capacitance between the gate structures 129.

Figure 11:
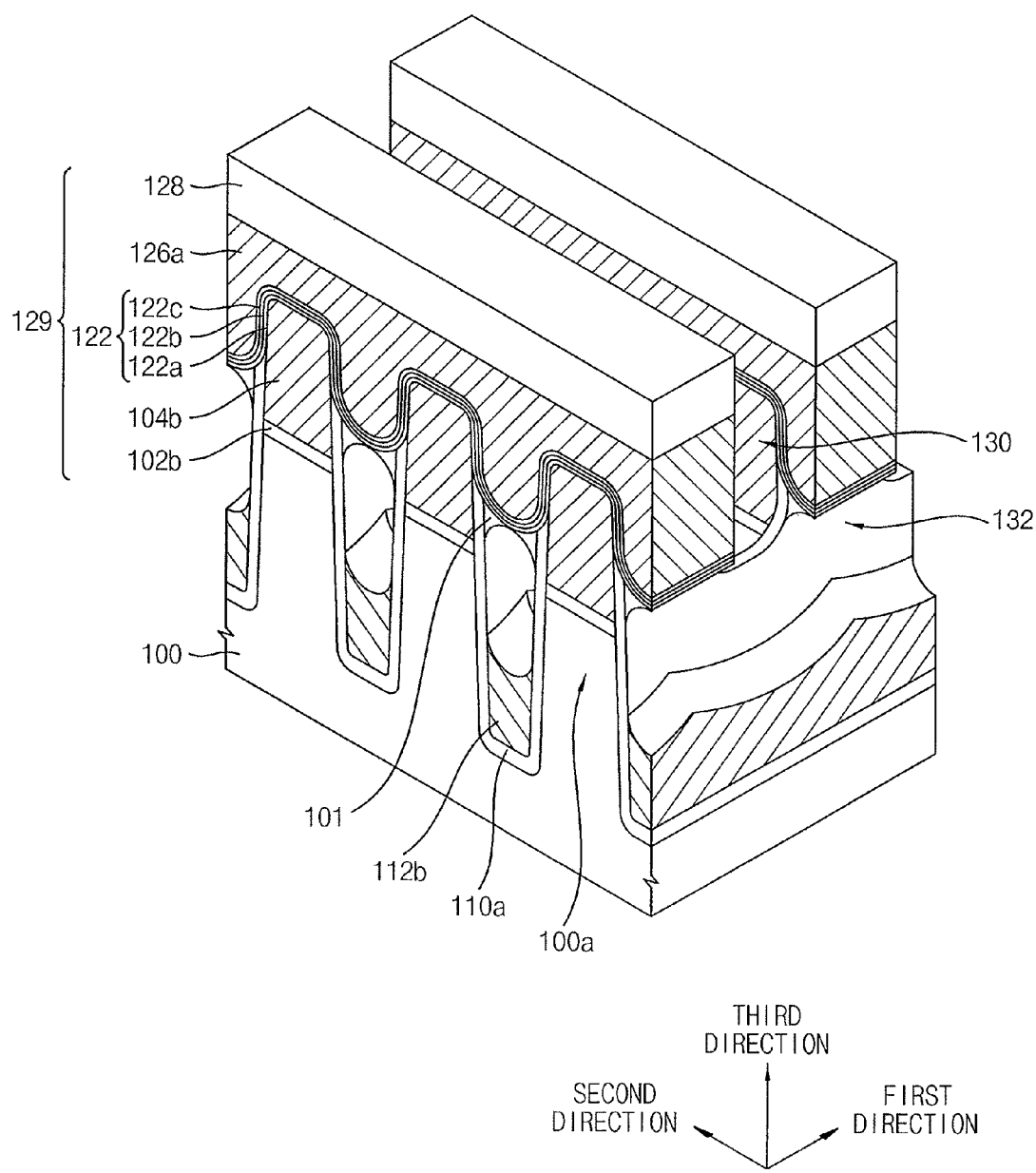

Referring to FIG. 11, the second preliminary isolation pattern 112a exposed by the second trench 130 may be partially removed by an isotropic dry etching process to form an isolation pattern 112b. Thus, the first air gap 132 may be formed on the isolation pattern 112b. The isotropic dry etching process may include a gas-phase etching process. In example embodiments, the isotropic dry etching process may be performed by using an apparatus for a dry cleaning process.

When the second preliminary isolation pattern 112a is etched, the tunnel insulation pattern 102a and the dielectric layer structure 122 including silicon oxide may not be etched. Thus, an etch rate of the second preliminary insulation layer pattern 112a may be greater than an etch rate of each of the tunnel insulation pattern 102a and dielectric layer structure 122 during the isotropic dry etching process. In example embodiments, an etching gas used in the isotropic dry etching process may include a gas containing fluorine and H$_2$O vapor, which may be, e.g., C$_x$F$_y$, CH$_x$F$_y$, etc.

Particularly, the H$_2$O vapor may be selectively absorbed into the second preliminary isolation pattern 112a. The second preliminary isolation pattern 112a may include, e.g., silicon oxide having pores therein, which may have crystal defects and dangling bonds therein more than those of the oxide included in the tunnel insulation pattern 102b and the dielectric layer structure 122. Thus, the H$_2$O vapor may be easily absorbed into the second preliminary isolation pattern 112a, while the H$_2$O vapor may be hardly absorbed into the tunnel insulation pattern 102b and the dielectric layer structure 122.

When the H$_2$O vapor is absorbed into the second preliminary isolation layer 112a, a bond of silicon and oxygen in the second preliminary isolation pattern 112a may be rapidly replaced with a bond of silicon and fluorine. Thus, the second preliminary isolation pattern 112a having moisture may be rapidly etched using the gas containing fluorine as an etching gas. The isotropic dry etching may be performed at a temperature of about 5° C. to about 50° C. so that the H$_2$O vapor may be rapidly absorbed into the second preliminary isolation pattern 112a.

However, the H$_2$O vapor may be hardly absorbed into the tunnel insulation pattern 102b and the dielectric layer structure 122, so that a bond of silicon and oxygen in the second preliminary isolation pattern 112a may not be easily replaced with a bond of silicon and fluorine. Thus, the tunnel insulation pattern 102b and the dielectric layer structure 122 may not be etched by the gas containing fluorine.

In the isotropic dry etching process, an etch rate of each of the tunnel insulation pattern 102b and the oxide layer patterns 122a and 122c of the dielectric layer structure 122 with respect to an etch rate of the second preliminary isolation pattern 112a may be about 1/50 to about 1/300. The tunnel insulation pattern 102b and the dielectric layer structure 122 may not be damaged and etched during the etching process, so that the non-volatile memory device may have good electrical characteristics.

If the second preliminary isolation pattern 112a were to be wet etched by using a hydrofluoric acid (HF) as an etchant, an etch rate of each of the tunnel insulation pattern 102b and the oxide layer patterns 122a and 122c of the dielectric layer structure 122 with respect to an etch rate of the second preliminary isolation pattern 112a would be about 1/1.5 to about 1/5. Thus, the tunnel insulation pattern 102b and the dielectric layer structure 122 would be partially etched during the wet etching process, so that the non-volatile memory device would not have had good electrical characteristics.

In the isotropic dry etching process according to embodiments, an exposed upper portion of the second preliminary isolation pattern 112a may be etched, and the first air gap 132 may extend in the first direction.

The second preliminary isolation pattern 112a between the gate structures 122 may be etched in the first direction.

A portion of the second preliminary isolation pattern 112a under a center portion of the gate structure 122 in the first direction may be etched less than other portions of the second preliminary isolation pattern 112a, e.g., a portion thereof between the gate structures 122. Thus, a top surface of the isolation pattern 112b may be bent in a cross-sectional view taken along the first direction. That is, a portion of a top surface of the isolation pattern 112b under the center portion of the gate structure 122 in the first direction may protrude from other portions of the top surface of the isolation pattern 112b.

As a level of the top surface of the isolation pattern 112b may be lowered, a volume of the first air gap 132 may increase. In order to reduce parasitic capacitance between the active patterns 100a, the top surface of the isolation pattern 112b may be lower than a top surface of the active pattern 100a. For example, the top surface of the isolation pattern 112b may be lower than about 70% of a height of the top surface of the active pattern 100a.

An uppermost level of the top of the first air gap 132 may be higher than that of the top surface of the active pattern 100a. A second length from a lowermost level of a bottom of the first air gap 132 to a level of the top surface of the active pattern 100a may be about 1.5 times to about 5 times of a third length from the level of the top surface of the active pattern 100a to the uppermost level of the top of the first air gap 132.

In the isotropic etching process, the liner 110a may be exposed, but may not be etched. Thus, a width in the second direction of the first air gap 132 may be limited to a width of the first trench 108 including the liner 110a therein. A first width in the second direction of the first air gap 132 may be longer than a first length in the third direction of the first air gap 132. In example embodiments, the first length of the first air gap 132 may be about 1.5 times to about 6 times of the first width of the first air gap 132.

In example embodiments, a portion the second preliminary isolation pattern 112a remaining directly beneath a bottom of the dielectric layer structure 122 may form the insulation layer pattern 101. In this case, the top of the first air gap 132 may be defined by the insulation layer pattern 101. In example embodiments, each of the top and bottom of the first air gap 132 between the isolation pattern 112b and dielectric layer structure 122 may be curved. In a cross-sectional view taken along the second direction, the first air gap 132 may have a long oval shape.

Figure 12:
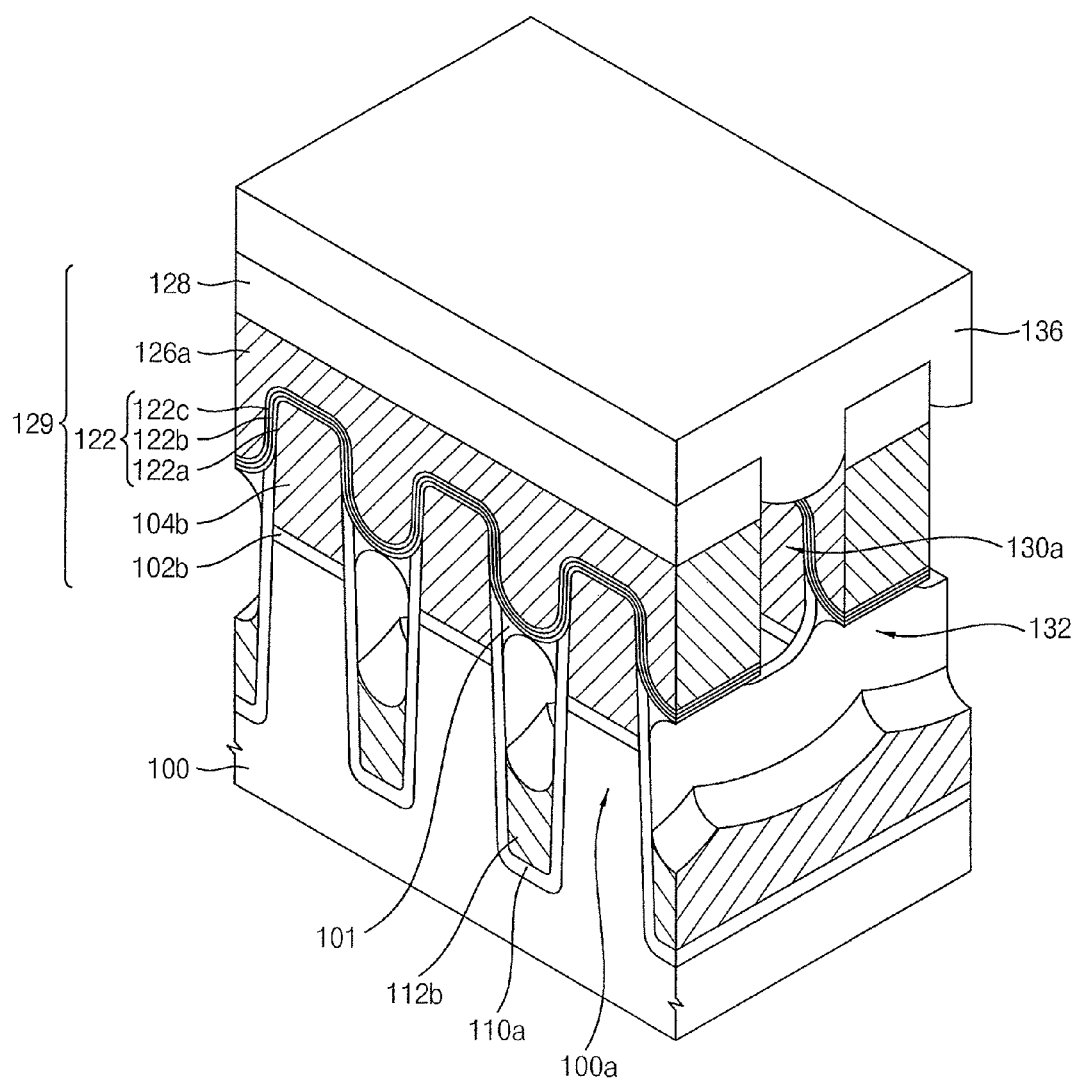

Referring to FIG. 12, an insulating interlayer 136 may be formed to fill an upper portion of the second trench 130 between the control gate patterns 126a. In detail, the insulating interlayer 136 may be formed of silicon oxide having a low step coverage, e.g., a plasma enhanced oxide or middle temperature oxide (MTO). In example embodiments, a bottom of the insulating interlayer 136 may be higher than a bottom of the control gate pattern 126a. Thus, a second air gap 130a may be formed between the control gate patterns 126a to be in communication with the first air gap 132.

The second air gap 130a may extend in the second direction to have an air tunnel shape. Due to the second air gap 130a parasitic capacitance between the control gate patterns 125a may decrease.

Wirings including a common source line and a bit line may be formed on the insulating interlayer 136, so that the non-volatile memory device may be manufactured.

Figure 13:
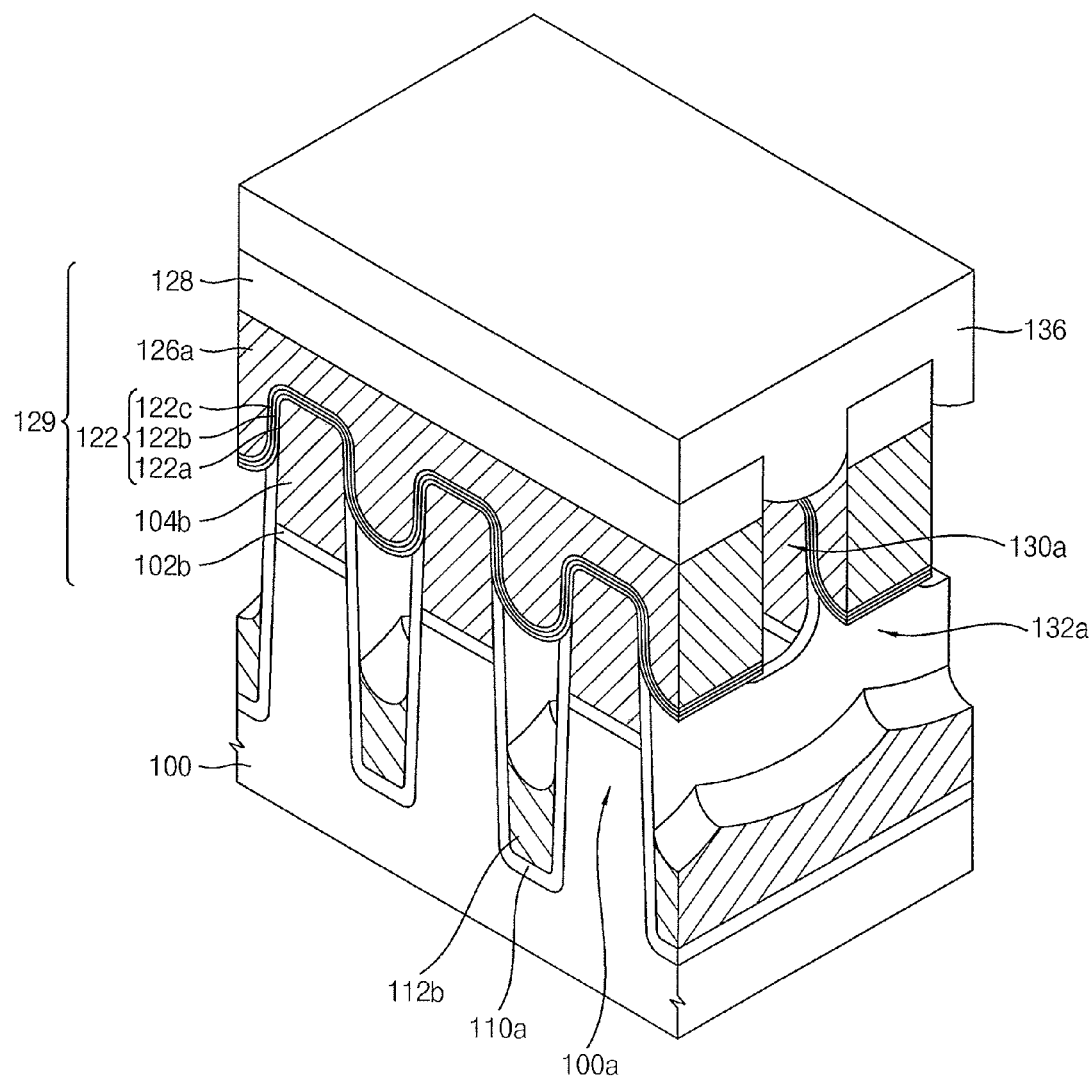
FIG. 13 illustrates a perspective view of a non-volatile memory device in accordance with example embodiments.
Figure 13:
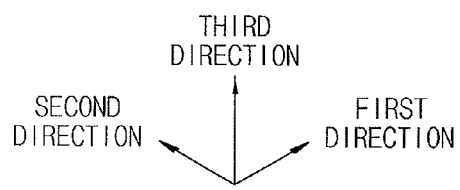

FIG. 13 is a perspective view illustrating a non-volatile memory device in accordance with example embodiments.

The non-volatile memory device may be substantially the same as the non-volatile memory device illustrated with reference to FIGS. 1 to 3, except for the shape of the first air gap and the insulation layer pattern beneath the dielectric layer structure. Thus, like reference numerals refer to like elements, and detailed descriptions thereof are omitted herein.

Referring to FIG. 13, no insulation layer pattern may be formed beneath the dielectric layer structure 122. Thus, a top of the first air gap 132a may be determined by a bottom of the dielectric layer structure 122. In a cross-sectional view taken along the second direction, the top surface of the first air gap 132a may be concave upward.

Figure 14:
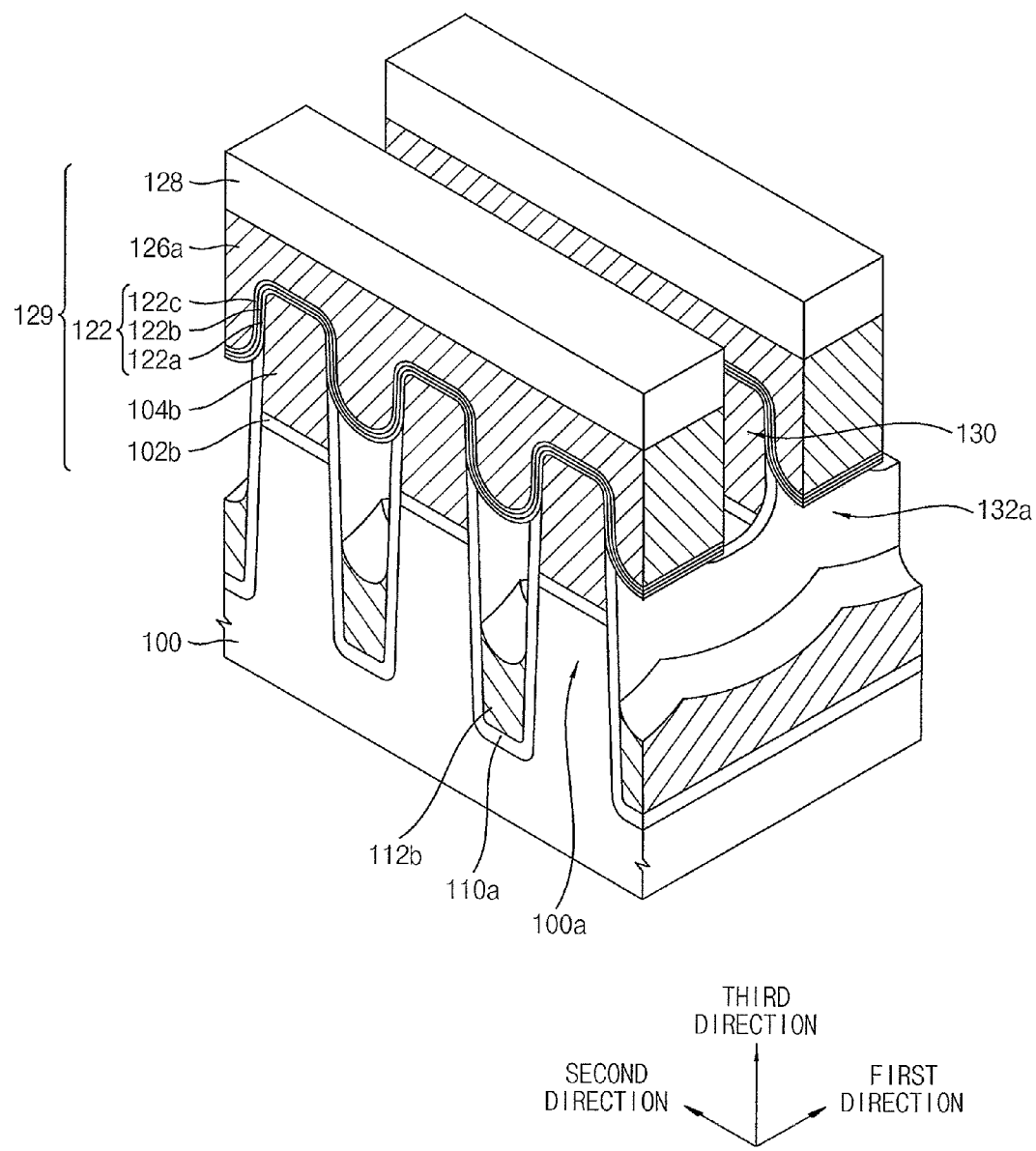
FIG. 14 illustrates a perspective view of a non-volatile memory device in accordance with example embodiments.

FIG. 14 is a perspective view illustrating stages in a method of manufacturing the non-volatile memory device of FIG. 13. The non-volatile memory device may be manufactured by performing processes substantially the same as or similar to those illustrated with reference to FIGS. 4 to 12, e.g., processes substantially the same as or similar to those illustrated with reference to FIGS. 4 to 10 may be performed.

Referring to FIG. 14, the second preliminary isolation pattern 112a under the dielectric layer structure 122 may be completely removed by an isotropic dry etching process to form the isolation pattern 112b. The isotropic dry etching process may be substantially the same as or similar to those illustrated with reference to FIG. 11. Thus, the first air gap 132a may be formed on the isolation pattern 112b. A top and a bottom of the first air gap 132a at the first portion thereof may be concave upward. Then, processes substantially the same as or similar to those illustrated with reference to FIG. 12 may be performed to manufacture the non-volatile memory device of FIG. 13.

Figure 15:
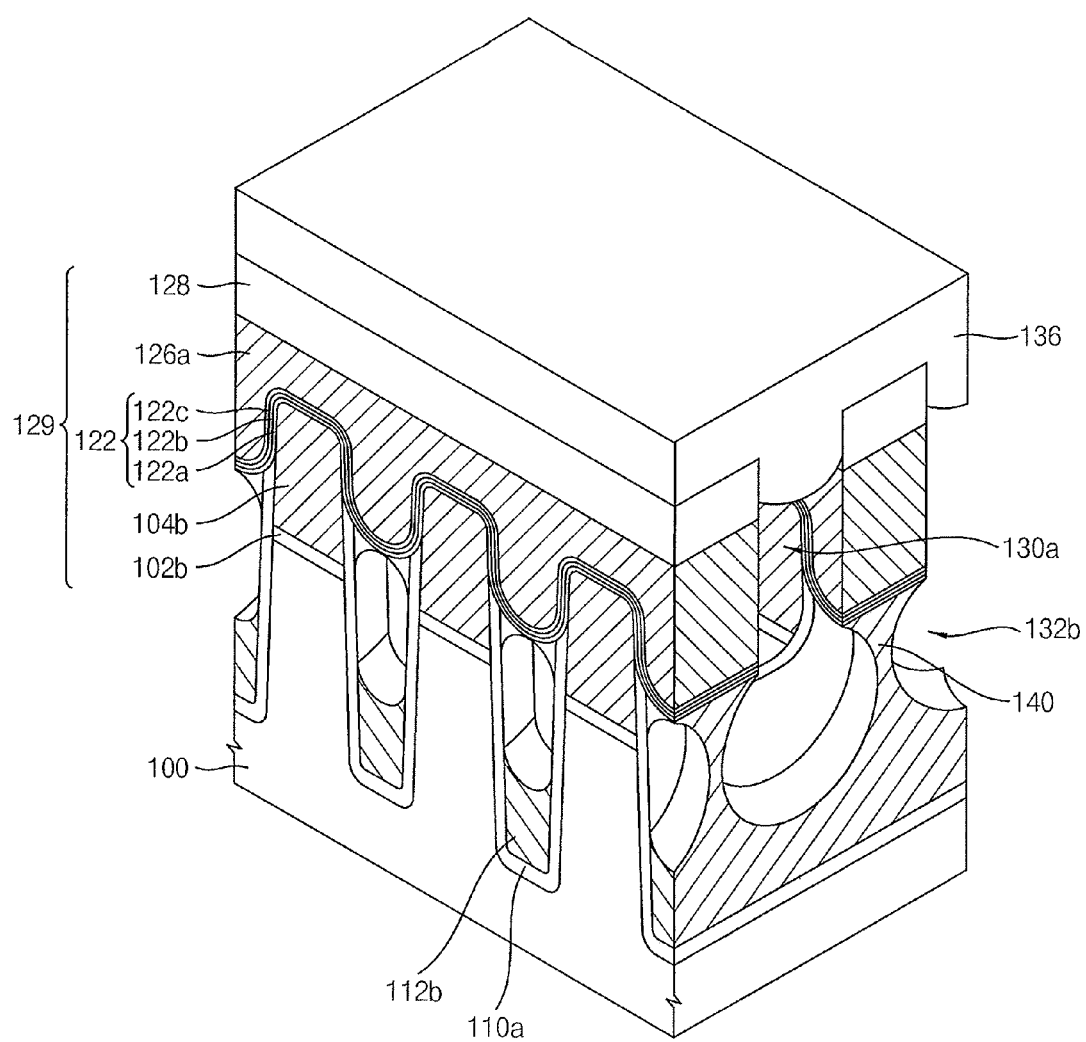
FIG. 15 illustrates a perspective view of a non-volatile memory device in accordance with example embodiments.
Figure 15:
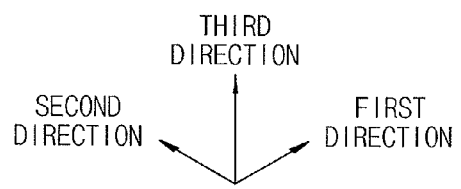

FIG. 15 is a perspective view illustrating a non-volatile memory device in accordance with example embodiments. The non-volatile memory device may be substantially the same as the non-volatile memory device illustrated with reference to FIGS. 1 to 3, except for the first air gap and a supporting pattern. Thus, like reference numerals refer to like elements, and detailed descriptions thereof are omitted herein.

Referring to FIG. 15, a supporting pattern 140 for supporting the dielectric layer structure 122 may be formed on the isolation pattern 112b. The supporting pattern 140 may be formed of a material substantially the same as a material of the isolation pattern 112b.

The supporting pattern 140 may be formed under the dielectric layer structure 122 to support at least a portion of the dielectric layer structure 122. A minimum width in the first direction of the supporting pattern 140 may be less than a width in the first direction of the bottom of the dielectric layer structure 122. Thus, the supporting pattern 140 may serve as a partition wall in the first direction between a plurality of first air gaps 132b. Each of the first air gaps 132b may be defined by the top surface of the isolation pattern 112b, the supporting pattern 140, and the liner 110a.

The non-volatile memory device may be manufactured by performing processes substantially the same as or similar to those illustrated with reference to FIGS. 4 to 12. In detail, first, processes substantially the same as or similar to those illustrated with reference to FIGS. 4 to 10 may be performed. Then, the second preliminary isolation pattern 112a may be partially removed by an isotropic dry etching process to form a recess, and a plurality of recesses may be formed to be spaced apart from each other in the first direction. The isotropic dry etching process may be substantially the same as or similar to those illustrated with reference to FIG. 11.

By the isotropic dry etching process, the isolation pattern 112b may be formed in the lower portion of the first trench 108, and the supporting pattern 140 for supporting the dielectric layer structure 122 may be formed on the isolation pattern 112b. Then, processes substantially the same as or similar to those illustrated with reference to FIG. 12 may be performed to manufacture the non-volatile memory device of FIG. 15.

Figure 16:
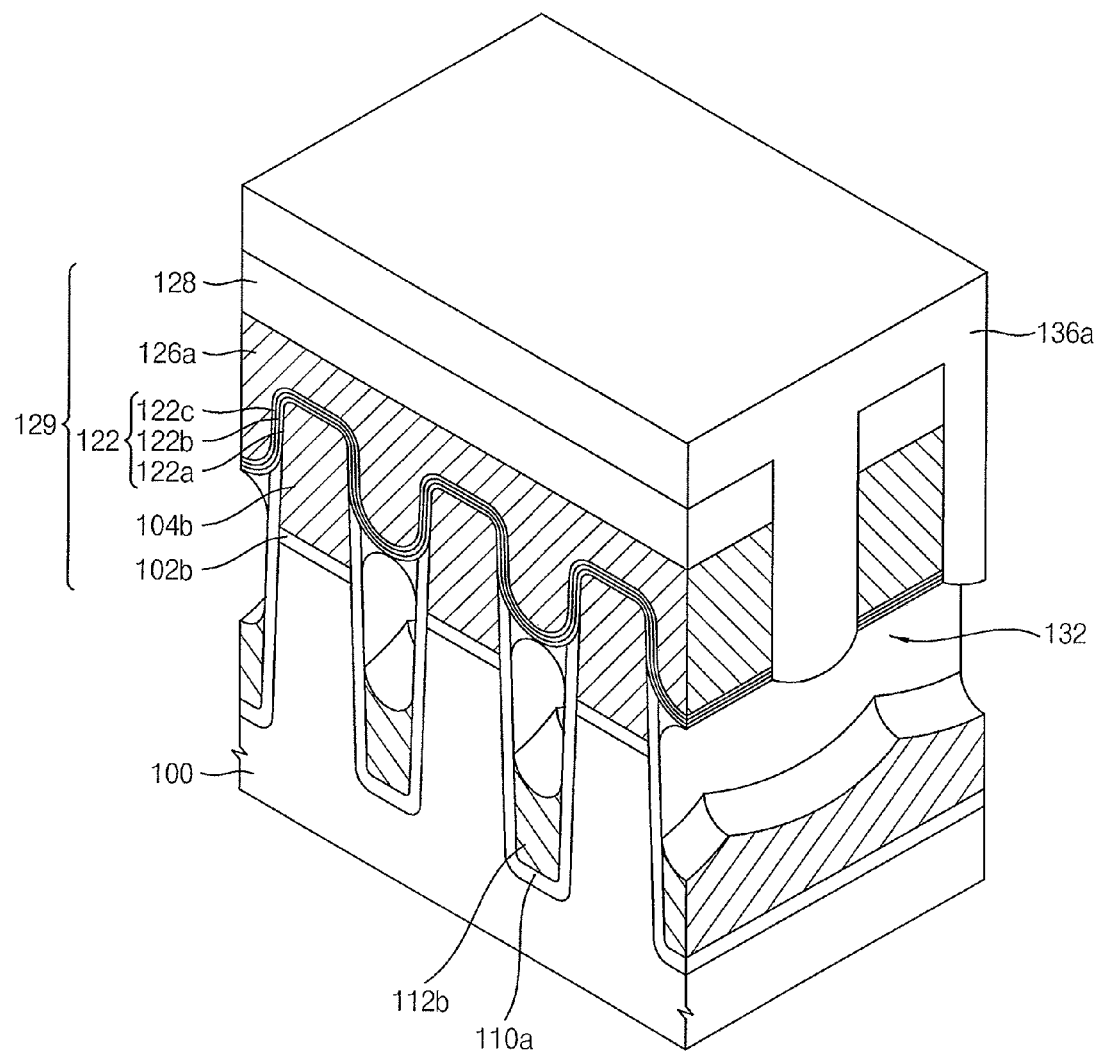
FIG. 16 illustrates a perspective view of a non-volatile memory device in accordance with example embodiments.
Figure 16:
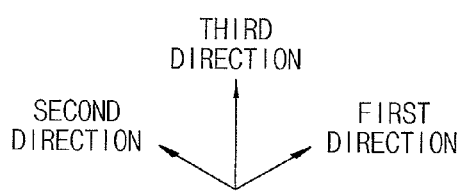

FIG. 16 is a perspective view illustrating a non-volatile memory device in accordance with example embodiments. The non-volatile memory device may be substantially the same as the non-volatile memory device illustrated with reference to FIGS. 1 to 3, except that the non-volatile memory device may have no second air gap. Thus, like reference numerals refer to like elements, and detailed descriptions thereof are omitted herein.

Referring to FIG. 16, an insulating interlayer 136a may be formed to fill a gap between the gate structures 129. A bottom of the insulating interlayer 136a may be higher than a bottom of the floating gate pattern 104b, and the first air gap 132 may extend in the first direction.

The non-volatile memory device may be manufactured by performing processes substantially the same as or similar to those illustrated with reference to FIGS. 4 to 12. In detail, first, processes substantially the same as or similar to those illustrated with reference to FIGS. 4 to 11 may be performed. Then, an insulating interlayer 136a may be formed to fill a gap between the gate structures 129. The insulating interlayer 136a may be formed to have a bottom higher than a bottom of the floating gate pattern 104b. Thus, the non-volatile memory device of FIG. 16 may be manufactured.

Figure 17:
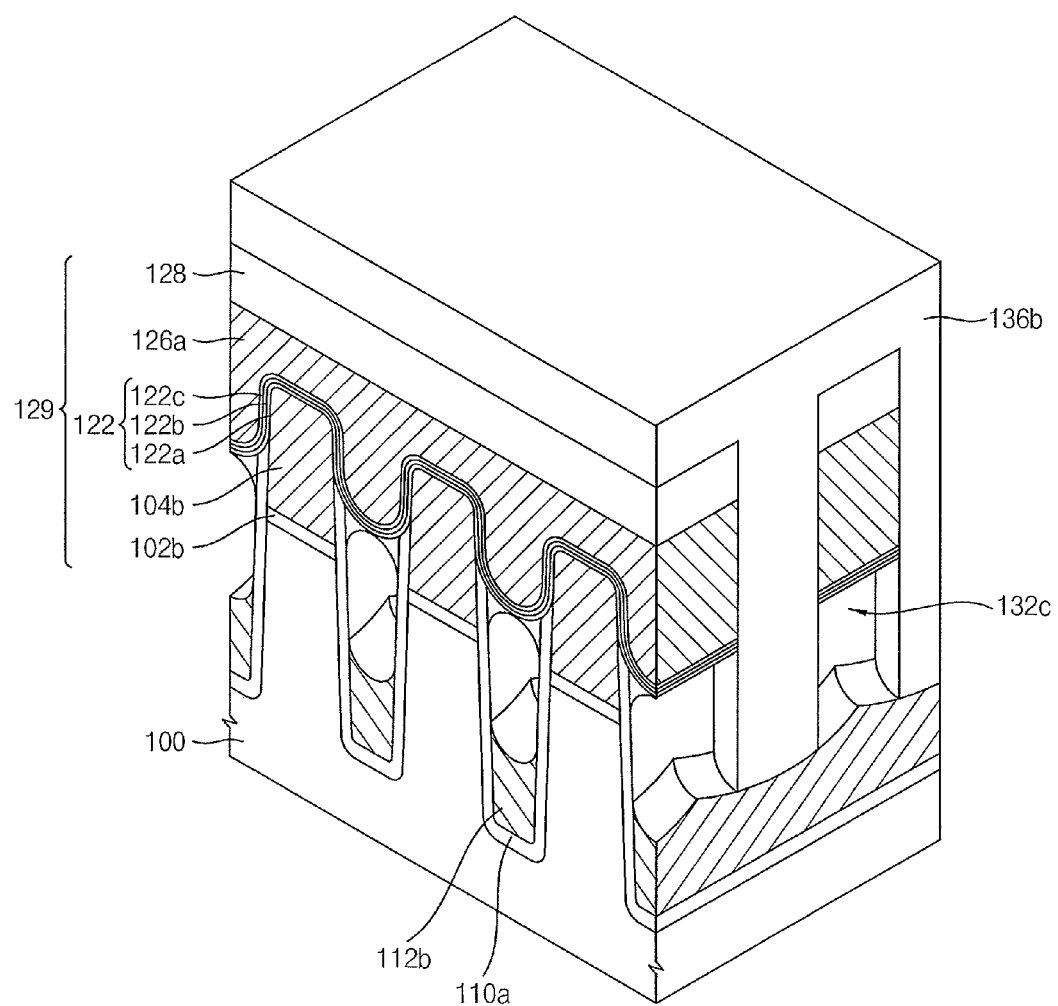
FIG. 17 illustrates a perspective view of a non-volatile memory device in accordance with example embodiments.
Figure 17:
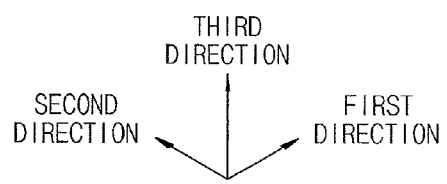

FIG. 17 is a perspective view illustrating a non-volatile memory device in accordance with example embodiments. The non-volatile memory device may be substantially the same as the non-volatile memory device illustrated with reference to FIGS. 1 to 3, except that the shape of the first air gap is different and no second air gap is formed therein. Thus, like reference numerals refer to like elements, and detailed descriptions thereof are omitted herein.

Referring to FIG. 17, an insulating interlayer 136b may be formed to fill a gap between the gate structures 129. The insulating interlayer 136b may extend in the third direction to a top surface of the isolation pattern 112b, and may be formed on the isolation pattern 112b. Thus, the insulating interlayer 136b may serve as a partition wall in the first direction between a plurality of the first air gaps 132c. Each of the first air gaps 132c may be defined by the top surface of the isolation pattern 112b, the insulation layer pattern, the insulating interlayer 136b, and the liner 110a.

The non-volatile memory device may be manufactured by performing processes substantially the same as or similar to those illustrated with reference to FIGS. 4 to 12 may be performed. In detail, first, processes substantially the same as or similar to those illustrated with reference to FIGS. 4 to 11 may be performed. Then, the insulating interlayer 136b may be formed to fill a gap between the gate structures 129. The insulating interlayer 136b may be formed to extend in the third direction to the isolation pattern 112b. Thus, the non-volatile memory device of FIG. 17 may be manufactured.

Figure 18:
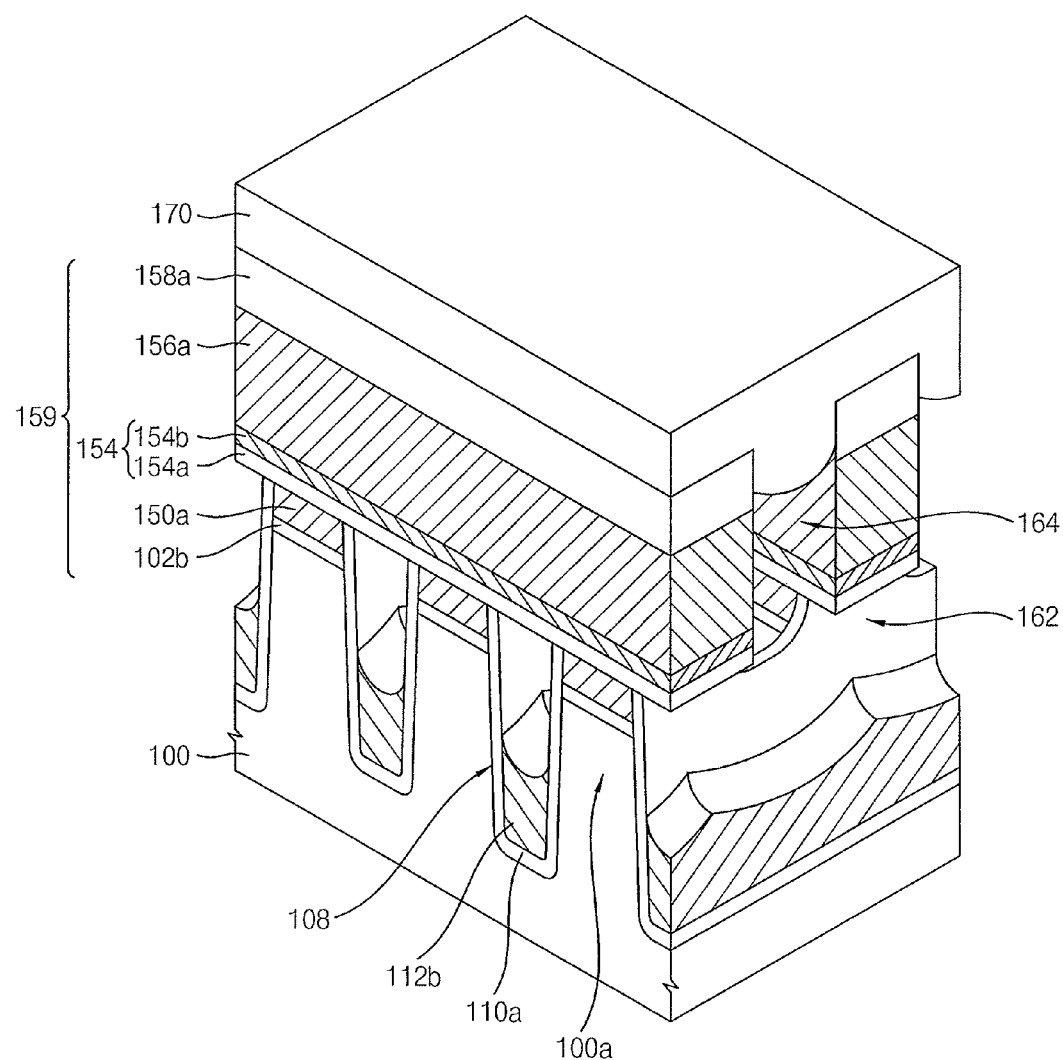
FIGS. 18 and 19 illustrate a perspective view and a cross-sectional view of a non-volatile memory device in accordance with example embodiments.
Figure 19:
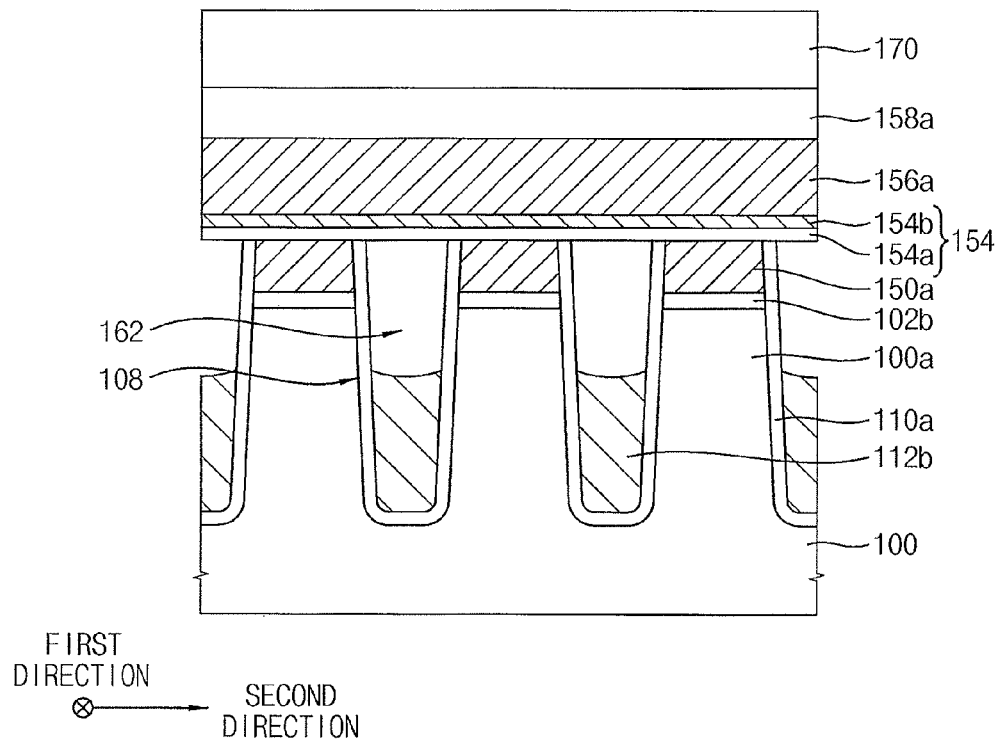

FIGS. 18 and 19 are a perspective view and a cross-sectional view, respectively, illustrating a non-volatile memory device in accordance with example embodiments. The non-volatile memory device may include a dielectric layer structure having a flat top surface.

Referring to FIGS. 18 and 19, the isolation pattern 112b may be formed on the substrate 100 to partially fill a lower portion of the first trench 108. The liner 110a may be formed on a sidewall and a bottom of the first trench 108.

The tunnel insulation pattern 102b may be formed on the active pattern 100a. A charge storage pattern 150a may be formed on the tunnel insulation pattern 102b, and a plurality of charge storage patterns 150a may be arranged to be spaced apart from each other both in the first and second directions. In example embodiments, the charge storage pattern 150a may include a floating gate pattern or a charge trapping layer pattern. The floating gate pattern may include, e.g., polysilicon. The charge trapping layer pattern may include, e.g., silicon nitride. Hereinafter, only the case in which the charge storage pattern 150a includes the floating gate pattern will be illustrated.

The floating gate pattern 150a may have a thickness of about 0.1 times to about 10 times of a thickness of the tunnel insulation pattern 102b.

A dielectric layer structure 154 may be formed on the floating gate pattern 150a. A bottom of the dielectric layer structure 154 may directly contact a top surface of the floating gate pattern 150a, and may be substantially flat. The dielectric layer structure 154 may extend in the second direction.

In example embodiments, the dielectric layer structure 154 may have a multi-layered structure of a silicon oxide layer pattern 154a and a metal oxide layer pattern 154b having a dielectric constant higher than a dielectric constant of silicon nitride. Alternatively, the dielectric layer structure 154 may have a multi-layered structure of a silicon oxide layer pattern, a silicon nitride layer pattern and a silicon oxide layer pattern sequentially stacked.

A control gate pattern 156a may be formed on the dielectric layer structure 154. The control gate pattern 156a may extend in the second direction, and a plurality of control gate patterns 156a may be arranged in the first direction. No portion of the control gate pattern 156a may face a sidewall of the floating gate pattern 140a in the second direction, that is, a bottom of the control gate pattern 156a may be higher than a top surface of the floating gate pattern 150a.

A first portion of the first air gap 162, which may be formed under a gate structure 159, may be defined by the top surface of the isolation pattern 112b, a bottom of the dielectric layer structure 154, and the liner 110a on the sidewall of the first trench 108. A bottom of the first air gap 162 at the first portion thereof may have a shape substantially the same as or similar to that illustrated with reference to FIGS. 1 to 3. The first air gap 162 and the sidewall of the floating gate pattern 150a may be opposite in the second direction to each other.

The non-volatile memory device may be manufactured by performing processes substantially the same as or similar to those illustrated with reference to FIGS. 4 to 12.

FIGS. 20 to 23 are cross-sectional views and perspective views illustrating stages of a method of manufacturing the non-volatile memory device of FIGS. 18 and 19.

Figure 20:
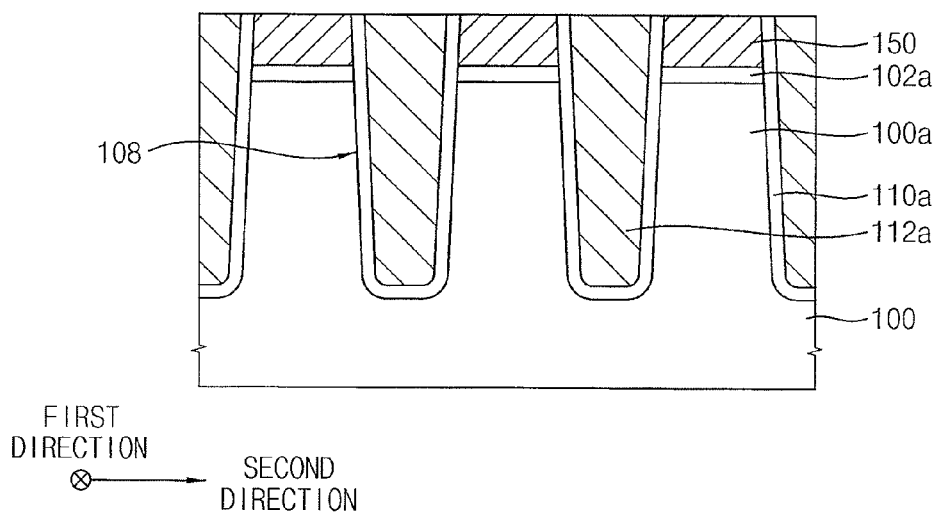
FIGS. 20 to 23 illustrate cross-sectional views and perspective views of stages in a method of manufacturing the non-volatile memory device of FIGS. 16 and 17.

Referring to FIG. 20, processes substantially the same as or similar to those illustrated with reference to FIGS. 4 to 6 may be performed. However, when the floating gate layer is formed, the floating gate layer may be formed to have a thickness of about 0.1 times to about 10 times of a thickness of the tunnel insulation layer. Thus, a preliminary tunnel insulation pattern 102a and a preliminary floating gate pattern 150 may be formed on the active pattern 100a, and a first preliminary isolation pattern may be formed in the first trench 108.

A first preliminary isolation pattern may be etched by an etch back process until top surfaces of the first preliminary isolation pattern and the preliminary floating gate pattern 150 may be substantially coplanar with each other. Thus, a second preliminary isolation pattern 112a may be formed from the first preliminary isolation pattern, and the first mask may be removed. The top surface of the preliminary floating gate pattern 150 may be exposed. The preliminary floating gate pattern 150 and the second preliminary isolation pattern 112a may have no height difference.

Figure 21:
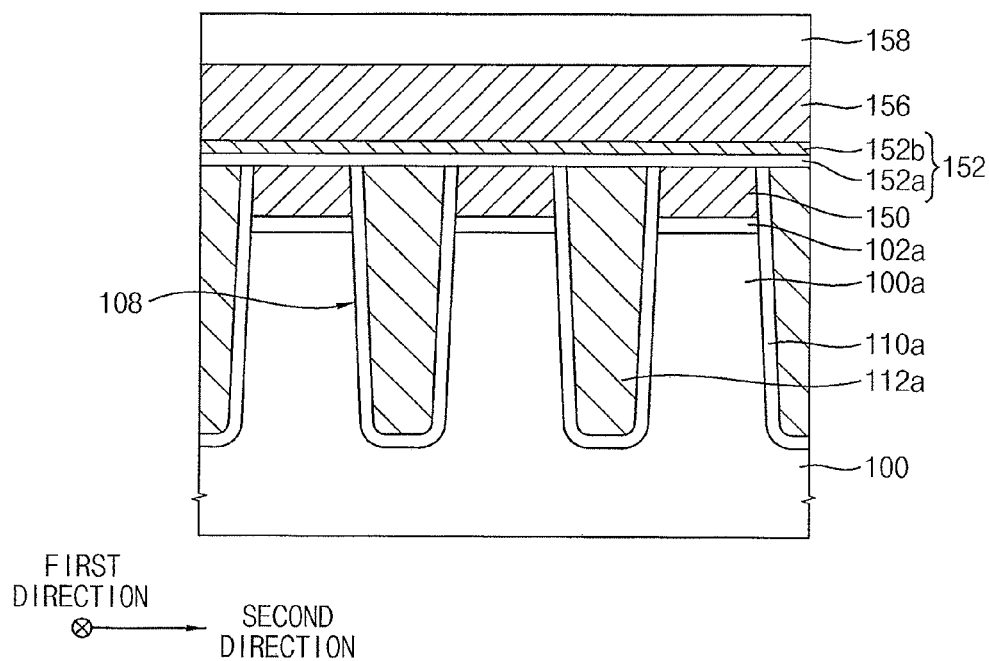

Referring to FIG. 21, a preliminary dielectric layer structure 152 may be conformally formed on the preliminary floating gate pattern 150 and the second preliminary isolation pattern 112a. A control gate layer 156 and a hard mask layer 158 may be sequentially formed on the preliminary dielectric layer structure 152. A top and a bottom of each of the preliminary dielectric layer structure 152, the control gate layer 156 and the hard mask layer 158 may be flat.

The processes may be substantially the same as or similar to those illustrated with reference to FIGS. 8 and 9.

Figure 22:
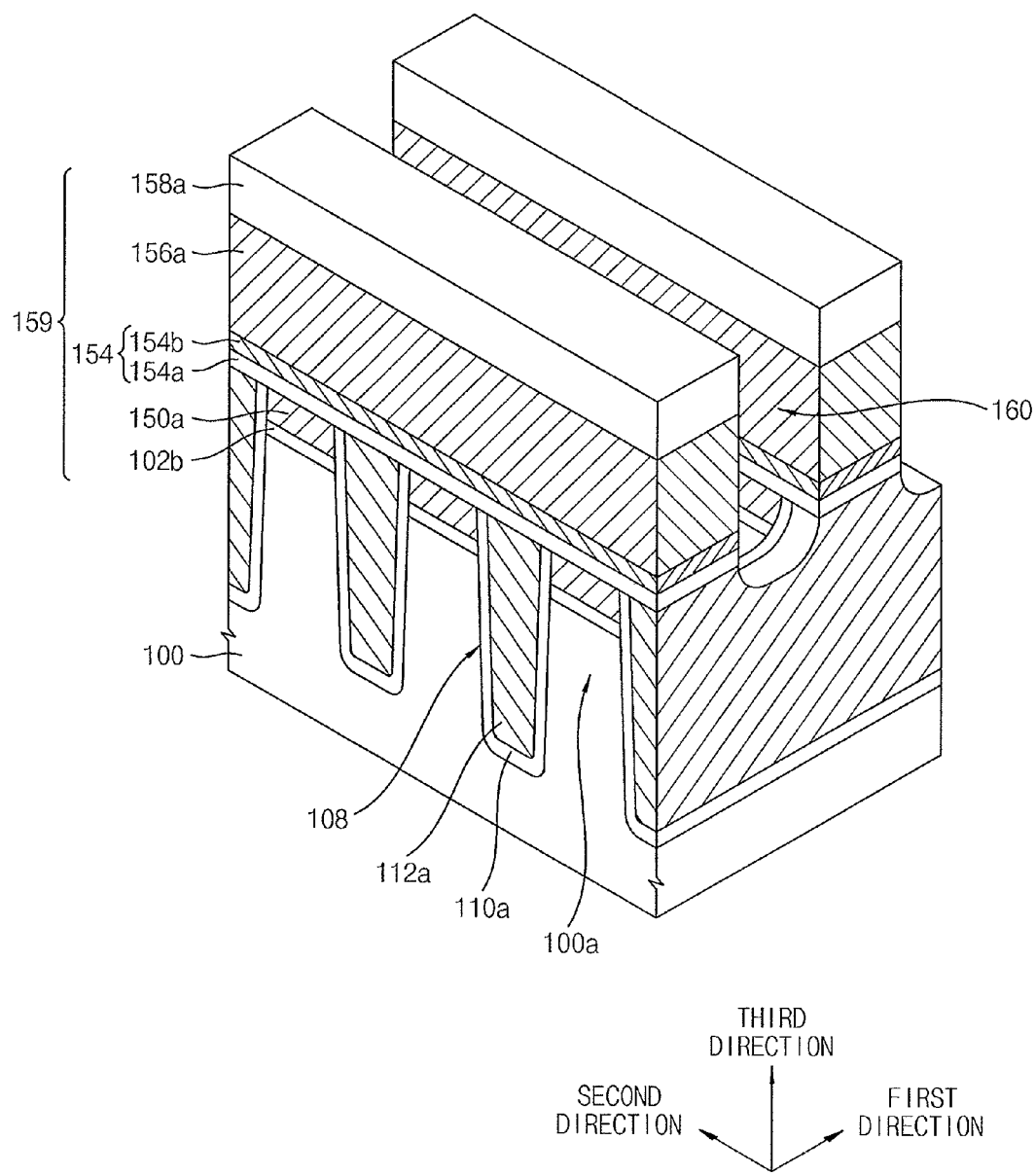

Referring to FIG. 22, the hard mask layer 158 may be patterned to form a hard mask 158a. The hard mask 158a may extend in the second direction.

The control gate layer 156, the preliminary dielectric layer structure 152, the preliminary floating gate layer pattern 150 and the first tunnel insulation pattern 102a may be anisotropically etched using the hard mask 158a as an etching mask. Thus, a gate structure 159 including a tunnel insulation pattern 102b, a floating gate pattern 150a, the dielectric layer structure 154, a control gate pattern 156a and the hard mask 158a sequentially stacked may be formed on the substrate 100. Also, a second trench 160 may be formed between the gate structures 159.

The processes may be substantially the same as or similar to those illustrated with reference to FIG. 10.

Figure 23:
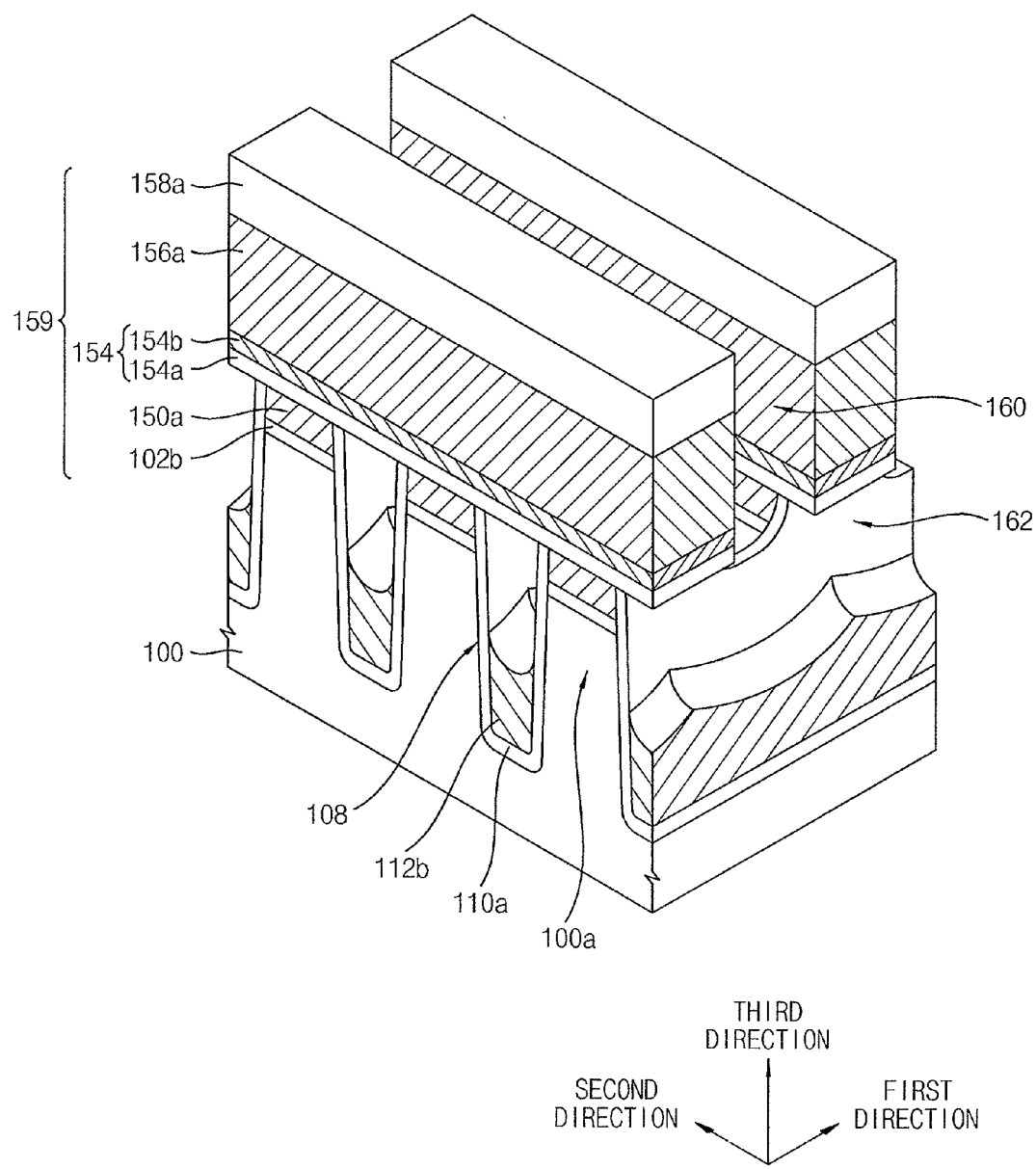

Referring to FIG. 23, the second preliminary isolation pattern 112a exposed by the second trench 130 may be partially removed by an isotropic dry etching process to form an isolation pattern 112b. Thus, a first air gap 162 may be formed between the isolation pattern 112b and the dielectric layer structure 154.

The processes may be substantially the same as or similar to those illustrated with reference to FIG. 11.

Referring to FIG. 18 again, an insulating interlayer 170 may be formed to partially fill an upper portion of the second trench 160 between the control gate patterns 156a. The insulating interlayer 170 may not fill a portion between the control gate patterns 156a, so that a second air gap 164 may be formed to be in communication with the first air gap 162.

The processes may be substantially the same as or similar to those illustrated with reference to FIG. 12.

As described above, the non-volatile memory device of FIGS. 18 and 19 may be manufactured.

In an embodiment, a three dimensional (3D) memory array is provided. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array.

In an embodiment, the 3D memory array includes vertical NAND strings that are vertically oriented such that at least one memory cell is located over another memory cell. The at least one memory cell may include a charge trap layer.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648. The above semiconductor device may be applied to various types of systems, e.g., computing system.

Figure 24:
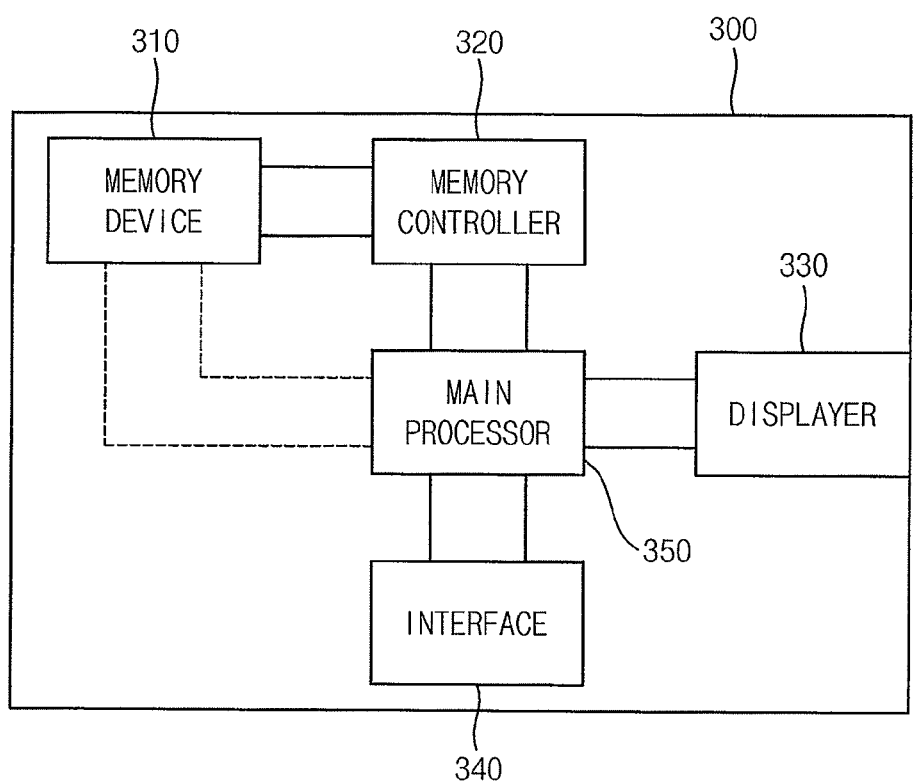
FIG. 24 illustrates a block diagram of a schematic construction of a system in accordance with example embodiments.

FIG. 24 is a block diagram illustrating a system in accordance with example embodiments.

Referring to FIG. 24, a system 300 may include a memory device 310, a memory controller 320 for controlling operations of the memory device 310, a displayer 330 for outputting data, an interface 340 for receiving data, and a main processor 350 for controlling elements in the system 310.

The memory device 310 may include a non-volatile semiconductor device in accordance with example embodiments. The memory device 310 may be directly connected to the main processor 350. Alternatively, the memory device 310 may be electrically connected to the main processor 350 via a bus. The system 300 may be applied to a computer, a portable computer, a laptop computer, a personal digital assistant, a tablet personal computer, a mobile phone, a digital music player, etc.

By way of summary and review, example embodiments provide a non-volatile memory device having a reduced parasitic capacitance, and a method of manufacturing the same. That is, according to example embodiments, the non-volatile memory device may include air gaps between active patterns and between the charge storage patterns. Thus, parasitic capacitance between the active patterns and between the charge storage patterns may be decreased. Also, damages of the tunnel insulation pattern and the dielectric layer pattern may decrease. Thus, the non-volatile memory device may have good electrical characteristics.

In other words, a preliminary isolation layer pattern may be formed to include silicon oxide having pores therein, so the preliminary isolation layer pattern may be partially etched by an isotropic dry etching process to form an isolation layer pattern with an air gap. In the isotropic dry etching process, the $H_2O$ vapor may be selectively absorbed into the preliminary isolation layer pattern, and the preliminary isolation layer pattern having moisture may be etched using the gas containing fluorine as an etching gas. Thus, the isolation layer pattern and both of the tunnel insulation layer and the dielectric layer pattern may have a high etching selectivity, so that the air gap may be formed without the damages of the tunnel insulation layer and the dielectric layer pattern.

While example embodiments have been particularly shown and described, it will be understood by one of ordinary skill in the art that variations in form and detail may be made therein without departing from the spirit and scope of the claims.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing a non-volatile memory device, the method comprising:
   sequentially forming a preliminary tunnel insulation pattern and a preliminary charge storage pattern on each of a plurality of active patterns of a substrate, each of the plurality of active patterns extending in a first direction;
   defining a trench between structures, each structure including an active pattern of the plurality of active patterns, a corresponding preliminary tunnel insulation pattern, and a corresponding preliminary charge storage pattern sequentially stacked;
   forming a liner on an inner wall of the trench;
   forming a preliminary isolation pattern on the liner to partially fill the trench, the preliminary isolation pattern including a material different from a material of the liner;
   sequentially forming a dielectric layer and a control gate electrode layer on the preliminary charge storage pattern, the liner, and the preliminary isolation pattern;
   patterning the control gate electrode layer, the dielectric layer, the preliminary charge storage pattern, and the preliminary tunnel insulation pattern to form a plurality of gate structures, each gate structure extending in a second direction substantially perpendicular to the first direction, each of the gate structure including a tunnel insulation pattern, a charge storage pattern, a dielectric layer pattern, and a control gate electrode sequentially stacked;
   isotropically etching a portion of the preliminary isolation pattern to form an isolation pattern and a first air gap on the isolation pattern, the first air gap extending in the first direction and having a bent top,
   wherein a first length of the first air gap under the gate structures in a third direction substantially perpendicular to a top surface of the substrate is greater than a first width of the first air gap under the gate structures in the second direction; and
   forming an insulating interlayer between the gate structures to keep the first air gap.

2. The method as claimed in claim 1, wherein the isolation pattern includes silicon oxide having pores therein more than pores of silicon oxide included in the tunnel insulation pattern and the dielectric layer pattern.

3. The method as claimed in claim 2, wherein the isolation pattern includes a spin on glass (SOG).

4. The method as claimed in claim 2, wherein the silicon oxide included in the tunnel insulation pattern and the dielectric layer pattern are formed by a thermal oxidation process, a chemical vapor deposition (CVD) process or a high density plasma CVD (HDP-CVD) process.

5. The method as claimed in claim 1, wherein isotropically etching the portion of the preliminary isolation pattern is performed using a gas containing fluorine and $H_2O$ vapor as an etching gas.

6. The method as claimed in claim 5, wherein the gas containing fluorine includes $C_xF_y$ or $CH_xF_y$.

7. The method as claimed in claim 5, wherein isotropically etching the portion of the preliminary isolation pattern includes:
   absorbing the $H_2O$ vapor into the preliminary isolation pattern; and
   partially removing the preliminary isolation pattern having moisture using the gas containing fluorine.

8. The method as claimed in claim 7, wherein the isotropical etching is performed at a temperature of about 5° C. to about 50° C.

9. The method as claimed in claim 1, wherein the isolation pattern is formed to have a top surface lower than about 70% of a height of the active pattern.

10. The method as claimed in claim 1, wherein forming the insulating interlayer includes forming a second air gap under the insulating interlayer to be in communication with the first air gap.

11. A method of manufacturing a non-volatile memory device, the method comprising:

sequentially forming a preliminary tunnel insulation pattern and a preliminary charge storage pattern on each of a plurality of active patterns of a substrate, each of the plurality of active patterns extending in a first direction;

defining a trench between structures, each structure including an active pattern of the plurality of active patterns, a corresponding preliminary tunnel insulation pattern, and a corresponding preliminary charge storage pattern sequentially stacked;

forming a liner on an inner wall of the trench;

forming a preliminary isolation pattern on the liner to partially fill the trench, the preliminary isolation pattern including a material different from a material of the liner;

sequentially forming a dielectric layer and a control gate electrode layer on the preliminary charge storage pattern, the liner, and the preliminary isolation pattern;

patterning the control gate electrode layer, the dielectric layer, the preliminary charge storage pattern, and the preliminary tunnel insulation pattern to form a plurality of gate structures separated by a space, each gate structure extending in a second direction substantially perpendicular to the first direction, and each of the gate structure including a tunnel insulation pattern, a charge storage pattern, a dielectric layer pattern, and a control gate electrode sequentially stacked; and isotropically etching a portion of the preliminary isolation pattern in each trench through the space between the gate structure to form a first air gap between the isolation pattern and the dielectric layer, such that a distance between a top surface of a resultant isolation pattern and a bottom of the substrate is smaller than a distance between a top surface of an adjacent active pattern and the bottom of the substrate.

12. The method as claimed in claim 11, wherein forming the preliminary isolation pattern in the trench includes filling the trench with silicon oxide having pores therein.

13. The method as claimed in claim 12, wherein isotropically etching the portion of the preliminary isolation pattern is performed using a gas containing fluorine and $H_2O$ vapor as an etching gas.

14. The method as claimed in claim 12, wherein the preliminary isolation pattern has a higher etching rate than the tunnel insulation pattern and the dielectric layer pattern during the isotropically etching of the portion of the preliminary isolation pattern.

15. The method as claimed in claim 11, wherein isotropically etching the portion of the preliminary isolation pattern includes forming the first air gap with a height between the isolation pattern and the dielectric layer that is greater than a width of the trench.

* * * * *